US011011237B2

(12) United States Patent
Tsuda

(10) Patent No.: US 11,011,237 B2
(45) Date of Patent: May 18, 2021

(54) SEMICONDUCTOR MEMORY DEVICE WITH ERASE CONTROL

(71) Applicant: Kioxia Corporation, Minato-ku (JP)

(72) Inventor: Muneyuki Tsuda, Ichinomiya (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/787,368

(22) Filed: Feb. 11, 2020

(65) Prior Publication Data

US 2021/0043260 A1 Feb. 11, 2021

(30) Foreign Application Priority Data

Aug. 6, 2019 (JP) .............................. JP2019-144131

(51) Int. Cl.
| | |
|---|---|
| *G11C 16/16* | (2006.01) |
| *H01L 27/11582* | (2017.01) |
| *G11C 16/10* | (2006.01) |
| *G11C 16/04* | (2006.01) |
| *G11C 16/26* | (2006.01) |

(52) U.S. Cl.
CPC .......... *G11C 16/16* (2013.01); *G11C 16/0483* (2013.01); *G11C 16/107* (2013.01); *G11C 16/26* (2013.01); *H01L 27/11582* (2013.01); *G11C 2216/18* (2013.01)

(58) Field of Classification Search
CPC ... G11C 16/0483; G11C 16/107; G11C 16/16; G11C 16/26; G11C 2216/18; H01L 27/11582
See application file for complete search history.

(56) References Cited

U.S. PATENT DOCUMENTS

| | | | | |
|---|---|---|---|---|
| 6,335,882 B1 * | 1/2002 | Saeki | .................. | G11C 11/5635 365/185.02 |
| 7,633,813 B2 * | 12/2009 | Wang | .................. | G11C 11/5635 365/185.11 |
| 8,144,511 B2 * | 3/2012 | Dong | .................. | G11C 11/5628 365/185.03 |

(Continued)

OTHER PUBLICATIONS

Ho-Jung Kang, et al., "Space Program Scheme for 3-D NAND Flash Memory Specialized for the TLC Design", 2018 Symposium on VLSI Technology Digest of Technical Papers, 2018 pp. 201-202.

*Primary Examiner* — Richard Elms
*Assistant Examiner* — R Lance Reidlinger
(74) *Attorney, Agent, or Firm* — Oblon, McClelland, Maier & Neustadt, L.L.P.

(57) ABSTRACT

A semiconductor memory device includes: a memory cell array including a plurality of conductive layers, a semiconductor layer, and charge accumulating sections; and a control circuit that executes an erase operation. The erase operation includes an erase mode that executes a first erase flow. The first erase flow includes: a first write operation in which a first program voltage is applied to the plurality of conductive layers; a first erase operation that is executed after the first write operation, and in which, while a first voltage is applied to a first conductive layer, a voltage higher than the first voltage is applied to the second conductive layer; and a second erase operation that is executed after the first erase operation, and in which, while the first voltage is applied to a second conductive layer, a voltage higher than the first voltage is applied to the first conductive layer.

17 Claims, 18 Drawing Sheets

(56) References Cited

U.S. PATENT DOCUMENTS

| | | | | |
|---|---|---|---|---|
| 8,553,467 B2* | 10/2013 | Shimura | ............ | G11C 11/5635 |
| | | | | 365/185.29 |
| 9,842,659 B2* | 12/2017 | Nam | .................... | G11C 29/025 |
| 2016/0260490 A1* | 9/2016 | Lee | ................... | H01L 27/11582 |

* cited by examiner

● ··· Electron
Page write

○ ··· Hole
Flash erase

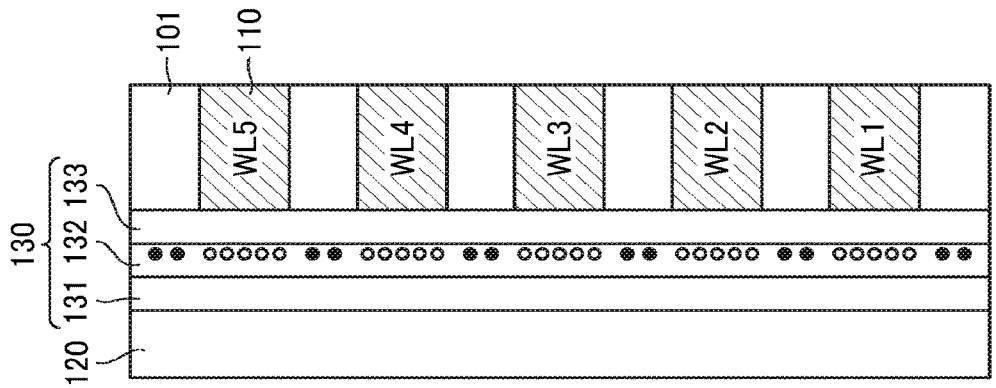
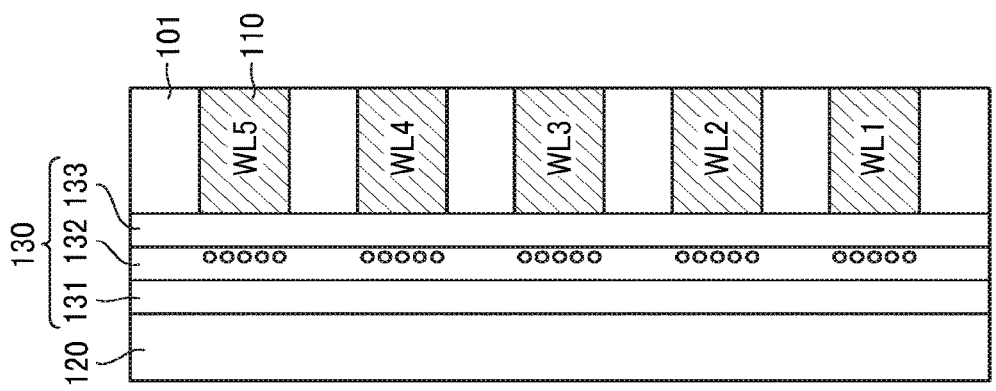
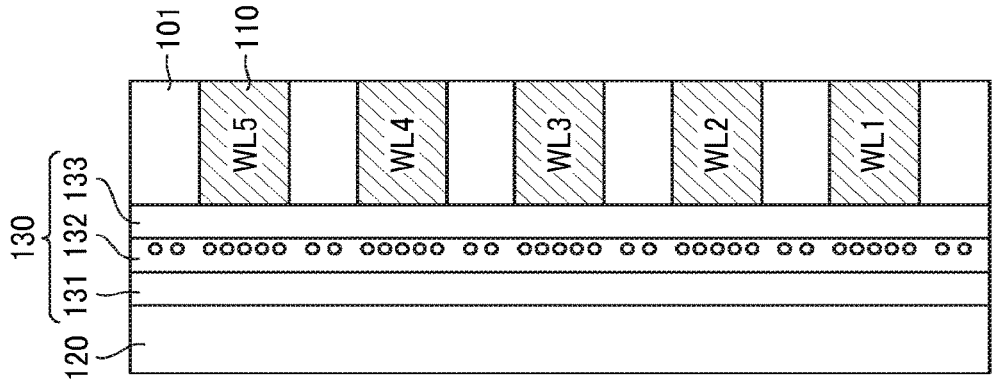

Inter-WL Read Operation

Flash Write Operation

Stripe Erase Operation (odd)

Stripe Erase Operation (even)

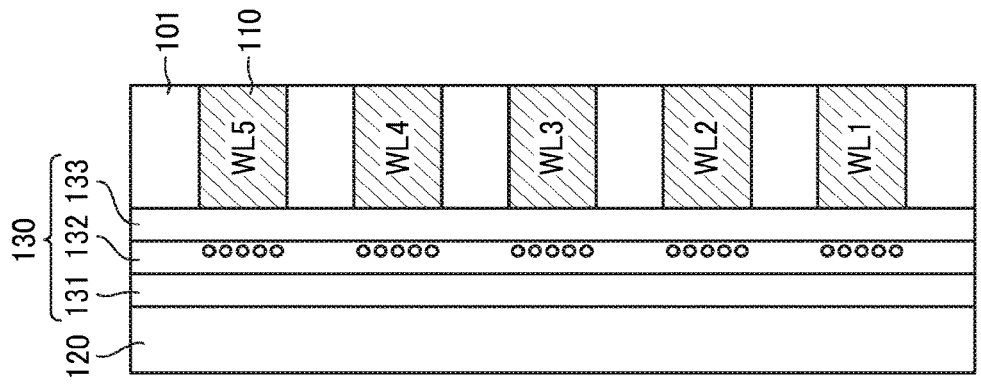
FIG. 15C Stripe erase (even)
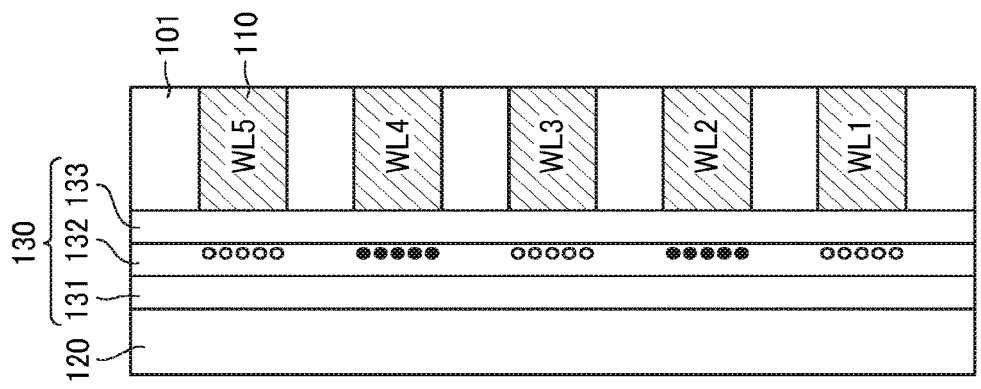
FIG. 15B Stripe erase (odd)
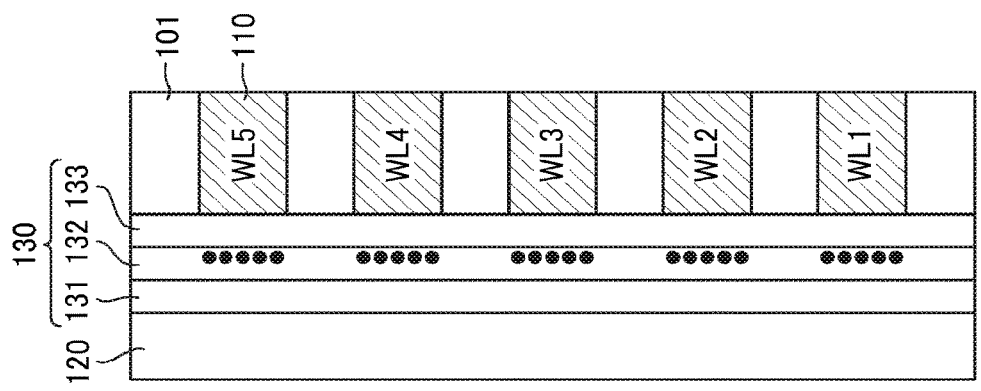
FIG. 15A Flash write

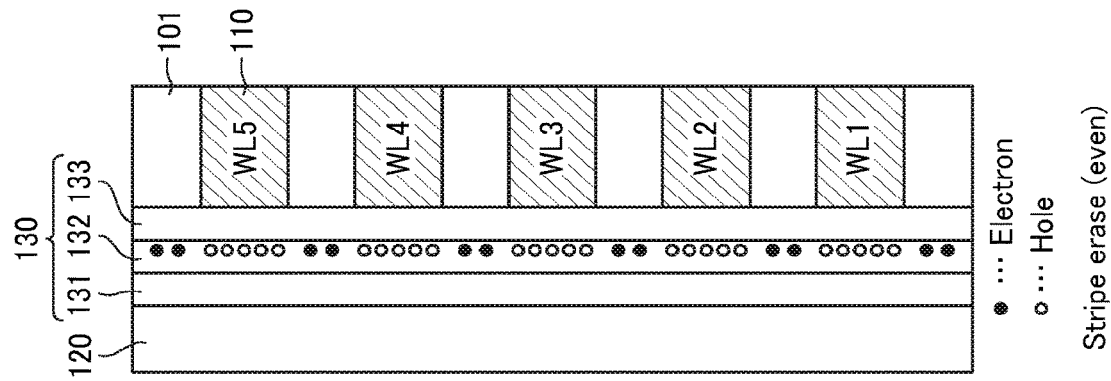
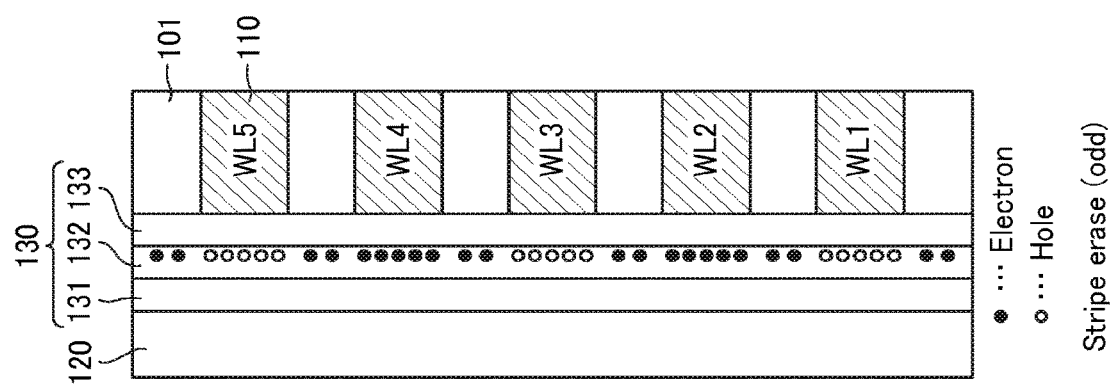
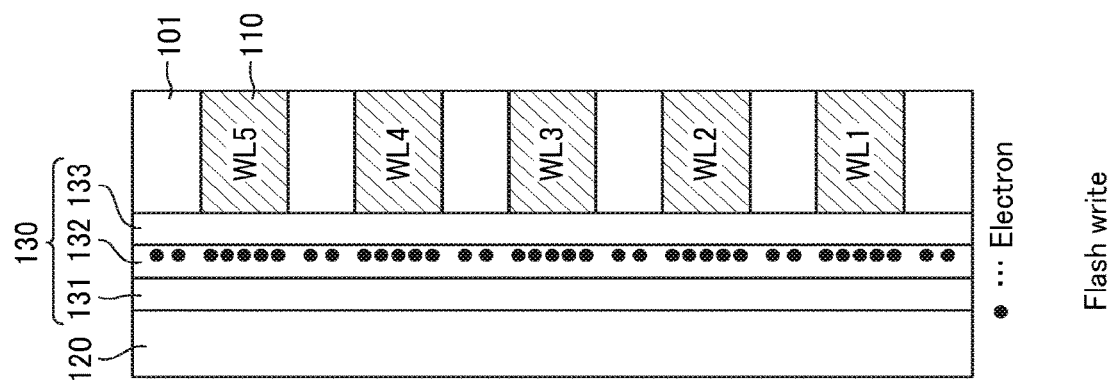

Stripe Write Operation (odd)

Stripe Write Operation (even)

Flash Erase Operation

SEMICONDUCTOR MEMORY DEVICE WITH ERASE CONTROL

CROSS-REFERENCE TO RELATED APPLICATIONS

This application is based upon and claims the benefit of Japanese Patent Application No. 2019-144131, filed on Aug. 6, 2019, the entire contents of which are incorporated herein by reference.

BACKGROUND

Field

The present embodiment relates to a semiconductor memory device.

Description of the Related Art

There is known a semiconductor memory device that comprises: a substrate; a plurality of wirings; and a semiconductor layer that opposes these plurality of wirings.

BRIEF DESCRIPTION OF THE DRAWINGS

FIGS. 8A to 8C are schematic cross-sectional views showing states of carriers after the erase operation of same semiconductor memory device.

FIGS. 15A to 15C are schematic cross-sectional views showing states of carriers in the first erase flow of same semiconductor memory device.

FIGS. 16A to 16C are schematic cross-sectional views showing states of carriers in the first erase flow of same semiconductor memory device.

DETAILED DESCRIPTION

Figure 1:
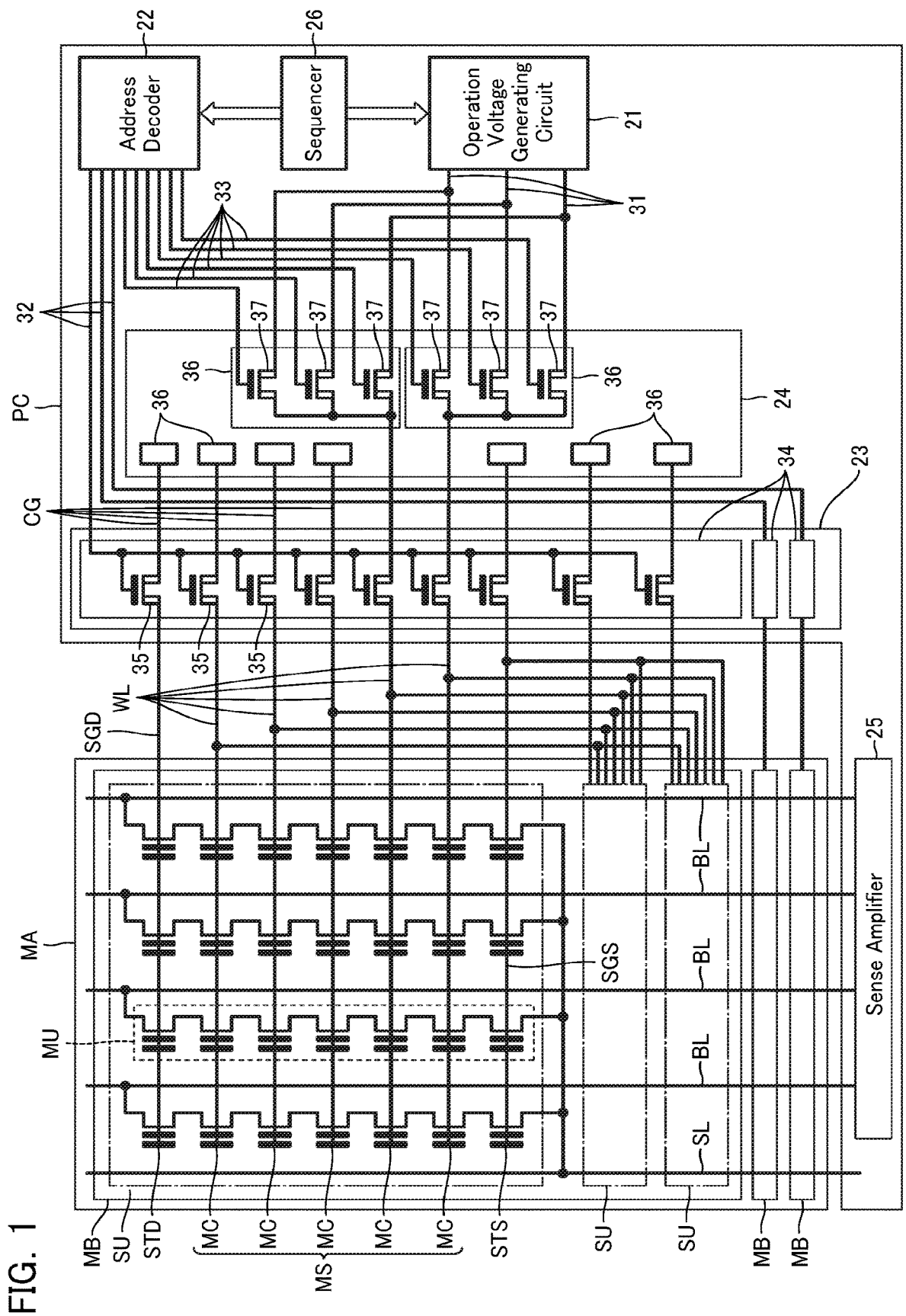
FIG. 1 is an equivalent circuit diagram showing a schematic configuration of a semiconductor memory device according to a first embodiment.

A semiconductor memory device according to one embodiment comprises: a substrate; a memory cell array comprising a plurality of conductive layers disposed in a first direction intersecting the substrate and each extending in a second direction intersecting the first direction, a semiconductor layer extending in the first direction and opposing the plurality of conductive layers, and charge accumulating sections respectively provided between the semiconductor layer and the plurality of conductive layers, the memory cell array including a plurality of memory cells formed in positions where the plurality of conductive layers and the semiconductor layer oppose, the plurality of memory cells being connected in series in the first direction to configure a memory string; and a control circuit that executes an erase operation by which data stored in the plurality of memory cells is erased. The plurality of conductive layers include: one or a plurality not adjacent in the first direction, of first conductive layers; and one or a plurality not adjacent in the first direction, of second conductive layers different from the first conductive layers. The erase operation includes an erase mode that executes a first erase flow in a state where the plurality of memory cells configuring the memory string have been simultaneously erased. The first erase flow includes: a first write operation in which a first program voltage is applied to the plurality of conductive layers; a first erase operation that is executed after the first write operation, and in which, while a first voltage is applied to the first conductive layer, a voltage higher than the first voltage is applied to the second conductive layer; and a second erase operation that is executed after the first erase operation, and in which, while the first voltage is applied to the second conductive layer, a voltage higher than the first voltage is applied to the first conductive layer.

Next, semiconductor memory devices according to embodiments will be described in detail with reference to the drawings. Note that the embodiments below are merely examples, and are not shown with the intention of limiting the present invention. Moreover, the drawings below are schematic, and, for convenience of explanation, some of configurations, and so on, will sometimes be omitted therefrom. Moreover, portions common to a plurality of embodiments will be assigned with the same symbols, and descriptions thereof will sometimes be omitted.

Moreover, in the present specification, a direction intersecting a surface of a substrate will be called a first direction, a direction intersecting the first direction will be called a second direction, and a direction intersecting the first direction and the second direction will be called a third direction. Moreover, a certain direction parallel to the surface of the substrate will be called an X direction, a direction parallel to the surface of the substrate and perpendicular to the X direction will be called a Y direction, and a direction perpendicular to the surface of the substrate will be called a Z direction. Note that in the description below, the case where the X direction, the Y direction, and the Z direction respectively correspond to the second direction, the third direction, and the first direction, will be exemplified. However, the first direction, the second direction, and the third direction are not limited to being the Z direction, the X direction, and the Y direction.

Moreover, in the present specification, expressions such as "up" or "down" will be defined with reference to the substrate. For example, an orientation of moving away from the substrate along the above-described first direction will be called up, and an orientation of coming closer to the substrate along the first direction will be called down. Moreover, when a lower surface or a lower end is referred to for a certain configuration, this will be assumed to mean a surface or end section on a substrate side of the configuration, and when an upper surface or an upper end is referred to for a certain configuration, this will be assumed to mean a surface or end section on an opposite side to the substrate of the configuration. Moreover, a surface intersecting the second direction or the third direction will be called a side surface.

Moreover, a "semiconductor memory device" referred to in the present specification has a variety of meanings, such as a memory die, a memory chip, a memory card, or a memory system including a control die, such as an SSD, or a configuration including a host computer, such as a smartphone, a tablet terminal, or a personal computer.

Moreover, in the present specification, when a first configuration is said to be "electrically connected" to a second configuration, it refers to the first configuration being connected directly, or via a circuit such as a wiring, a semiconductor member, or a transistor, to the second configuration. For example, even when, in the case of three transistors having been connected in series, the second transistor is in an OFF state, the first transistor is still "electrically connected" to the third transistor.

First Embodiment

[Configuration]

A configuration of a semiconductor memory device according to a first embodiment will be described below with reference to the drawings.

FIG. 1 is schematic equivalent circuit diagram showing the configuration of the semiconductor memory device according to the first embodiment.

The semiconductor memory device according to the present embodiment comprises: a memory cell array MA; and a peripheral circuit PC as a control circuit that controls the memory cell array MA.

The memory cell array MA comprises a plurality of memory blocks MB. These plurality of memory blocks MB each comprise a plurality of string units SU. These plurality of string units SU each comprise a plurality of memory units MU. One ends of these plurality of memory units MU are respectively connected to the peripheral circuit PC via bit lines BL. Moreover, the other ends of these plurality of memory units MU are each connected to the peripheral circuit PC via a common source line SL.

The memory unit MU comprises a drain select transistor STD, a plurality of memory cells MC (a memory string MS), and a source select transistor STS that are connected in series between the bit line BL and the source line SL. Hereafter, the drain select transistor STD and the source select transistor STS will sometimes simply be called select transistors (STD, STS), and so on.

The memory cell MC is a field effect type of transistor (a memory transistor) that comprises: a semiconductor layer functioning as a channel region; a gate insulating film including a charge accumulating film; and a gate electrode. A threshold voltage of the memory cell MC changes according to an amount of charge in the charge accumulating film. Note that gate electrodes of the plurality of memory cells MC corresponding to one memory string MS are respectively connected to word lines WL. These word lines WL are respectively commonly connected to all of the memory strings MS in one memory block MB.

The select transistor (STD, STS) is a field effect type of transistor that comprises: a semiconductor layer functioning as a channel region; a gate insulating film; and a gate electrode. Select gate lines (SGD, SGS) are respectively connected to gate electrodes of the select transistors (STD, STS). A drain select gate line SGD is provided correspondingly to the string unit SU and is commonly connected to all of the memory units MU in one string unit SU. A source select gate line SGS is commonly connected to all of the memory units MU in the plurality of string units SU in one memory block MB.

The peripheral circuit PC comprises: an operation voltage generating circuit 21 that generates an operation voltage; an address decoder 22 that decodes address data; a block select circuit 23 and a voltage select circuit 24 that transfer the operation voltage to the memory cell array MA according to an output signal of the address decoder 22; a sense amplifier 25 connected to the bit lines BL; and a sequencer 26 that controls these.

The operation voltage generating circuit 21 sequentially generates a plurality of types of operation voltages to be applied to the bit lines BL, the source line SL, the word lines WL, and the select gate lines (SGD, SGS) during a read operation, a write operation, and an erase operation on the memory cell array MA, and outputs the generated operation voltages to a plurality of operation voltage output terminals 31, according to a control signal from the sequencer 26. The operation voltage generating circuit 21 comprises a plurality of charge pump circuits and a plurality of regulator circuits, for example.

The address decoder 22 comprises a plurality of block select lines 32 and a plurality of voltage select lines 33. For example, the address decoder 22 sequentially refers to address data of an address register and decodes this address data to set to an "H" state certain block select lines 32 and voltage select lines 33 corresponding to the address data and set to an "L" state the other block select lines 32 and voltage select lines 33, according to a control signal from the sequencer 26.

The block select circuit 23 comprises a plurality of block selectors 34 corresponding to the memory blocks MB. These plurality of block selectors 34 each comprise a plurality of block select transistors 35 corresponding to the word lines WL and the select gate lines (SGD, SGS). The block select transistor 35 is a field effect type of high voltage-withstanding transistor, for example. One ends of the block select transistors 35 are respectively electrically connected to corresponding word lines WL or select gate lines (SGD, SGS). The other ends of the block select transistors 35 are respectively electrically connected to the operation voltage output terminals 31 via wirings CG and the voltage select circuit 24. Gate electrodes of the block select transistors 35 are commonly connected to a corresponding block select line 32.

The voltage select circuit 24 comprises a plurality of voltage selectors 36 corresponding to the word lines WL and the select gate lines (SGD, SGS). These plurality of voltage selectors 36 each comprise a plurality of voltage select transistors 37. The voltage select transistor 37 is a field effect type of high voltage-withstanding transistor, for example. One ends of the voltage select transistors 37 are respectively electrically connected to corresponding word lines WL or select gate lines (SGD, SGS), via the wirings CG and the block select circuit 23. The other ends of the voltage select transistors 37 are respectively electrically connected to corresponding operation voltage output terminals 31. Gate electrodes of the voltage select transistors 37 are respectively connected to corresponding voltage select lines 33.

The sense amplifier 25 is connected to a plurality of the bit lines BL. The sense amplifier 25 comprises a plurality of sense amplifier units corresponding to the bit lines BL, for example. The sense amplifier units each comprise: a clamp transistor that charges the bit line BL based on a voltage generated in the operation voltage generating circuit 21; a sense circuit that senses a voltage or current of the bit line BL; a plurality of latches that hold an output signal of this sense circuit, or write data, a verify pass flag FLG, and so on; and a logic circuit. During the read operation, for example, the logic circuit specifies data held in the memory cell MC by referring to data of a lower-order page held in the latch. Moreover, during the write operation, for example, the logic circuit controls the voltage of the bit line BL by referring to data of a lower-order page held in the latch.

The sequencer 26 outputs a control signal to the operation voltage generating circuit 21, the address decoder 22, and the sense amplifier 25, according to an inputted command and a state of the semiconductor memory device. For example, the sequencer 26 sequentially refers to command data of a command register in accordance with a clock signal, and decodes this command data to be outputted to the operation voltage generating circuit 21, the address decoder 22, and the sense amplifier 25.

Figure 2:
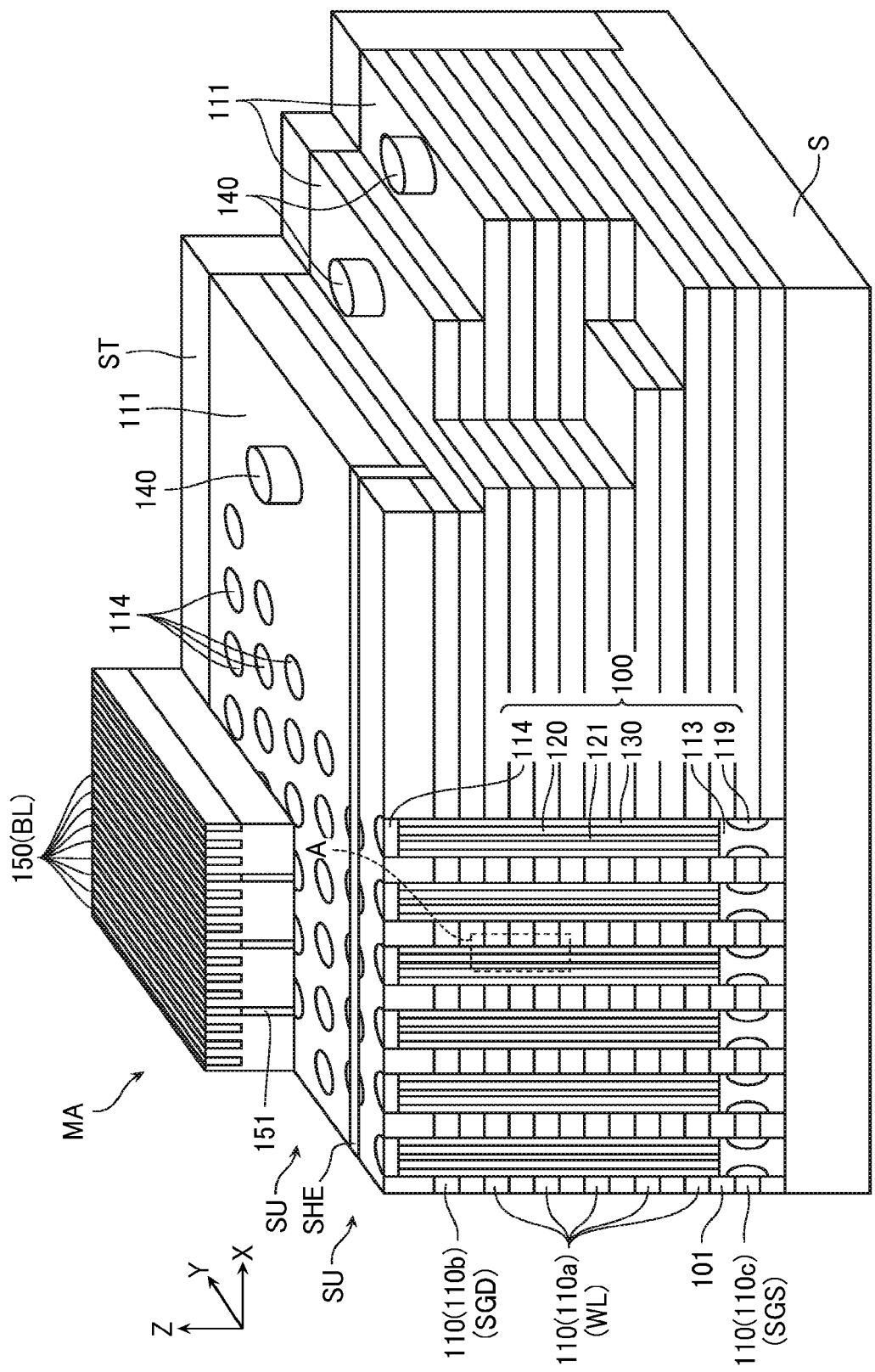
FIG. 2 is a schematic perspective view of same semiconductor memory device.

FIG. 2 is a schematic perspective view of the semiconductor memory device according to the present embodiment. For convenience of description, some of configurations are omitted in FIG. 2.

As shown in FIG. 2, the semiconductor memory device according to the present embodiment comprises: a substrate S; and the memory cell array MA provided above the substrate S.

The substrate S is a semiconductor substrate configured from the likes of single crystal silicon (Si), for example. The substrate S comprises a double well structure in which, for example, an N type impurity layer of the likes of phosphorus (P) is included in a surface of the semiconductor substrate, and a P type impurity layer of the likes of boron (B) is further included in this N type impurity layer. Moreover, in the present embodiment, the surface of the substrate S is a wiring layer functioning as a lower wiring. However, a separate wiring layer may be provided above the substrate S.

The memory cell array MA comprises: a plurality of memory structures 100 of columnar shape, for example, that extend in the Z direction; a plurality of conductive layers 110, plate-like, extending in an XY direction, for example, that cover outer circumferential surfaces of these plurality of memory structures 100 in an XY cross section; contacts 140 connected to these plurality of conductive layers 110; and a plurality of wirings 150 connected to upper ends of the memory structures 100.

The memory structures 100 are arranged in a certain pattern in the X direction and the Y direction. These memory structures 100 basically function as the memory units MU.

The memory structure 100 comprises: a semiconductor layer 120 extending in the Z direction; a gate insulating film 130 provided between the semiconductor layer 120 and the conductive layers 110; a semiconductor layer 113 connected between a lower end of the semiconductor layer 120 and the surface of the substrate S; and a semiconductor layer 114 connected to an upper end of the semiconductor layer 120.

The semiconductor layer 120 functions as the channel regions of the plurality of memory cells MC and the drain select transistor STD included in one memory unit MU (FIG. 1), for example. The semiconductor layer 120 has a substantially cylindrical shape, and has embedded in its center portion an insulating layer 121 of the likes of silicon oxide (SiO2), for example. The semiconductor layer 120 is a semiconductor layer of the likes of non-doped polycrystalline silicon (Si), for example.

Figure 3:
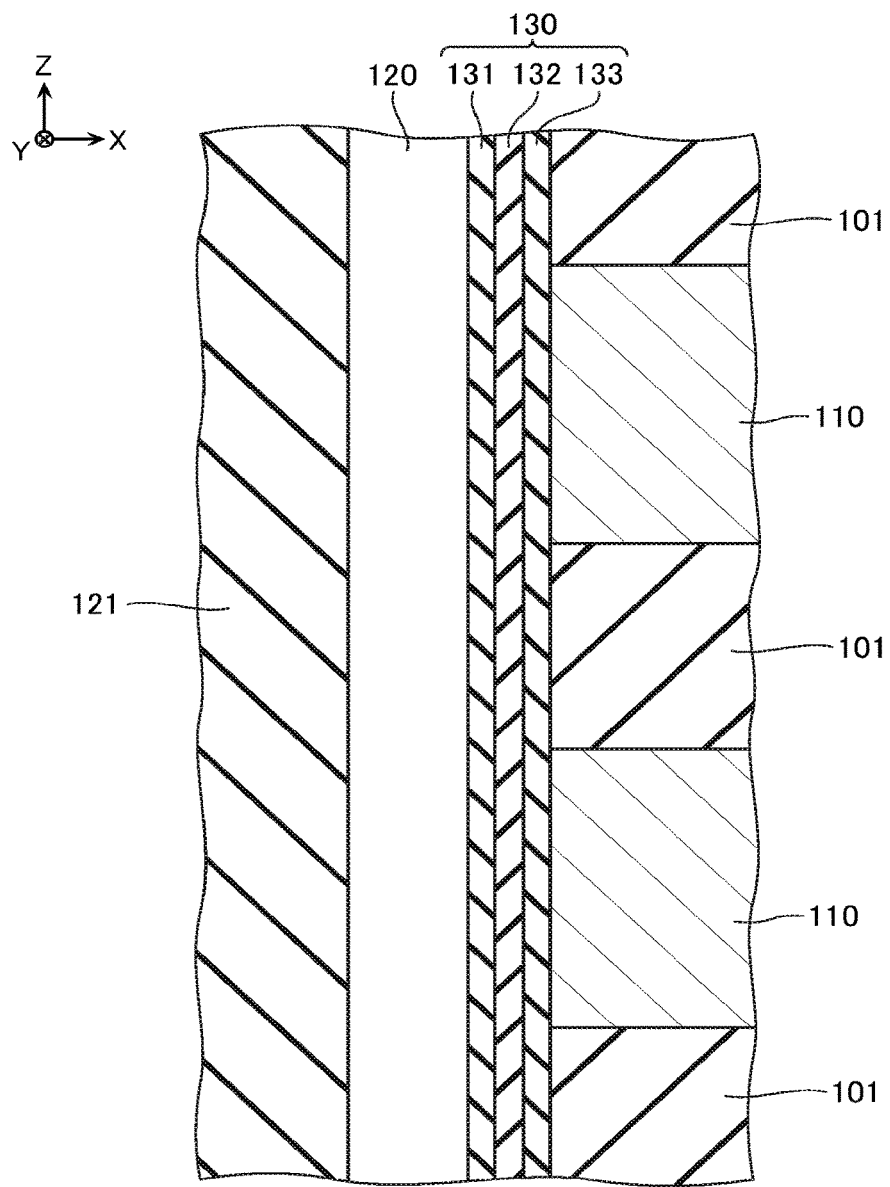
FIG. 3 is an enlarged view of part of FIG. 2.

The gate insulating film 130 is provided at each of intersections of the semiconductor layer 120 and the conductive layers 110. FIG. 3 is a cross-sectional view enlarging a section A of FIG. 2. As shown in FIG. 3, for example, the gate insulating film 130 comprises a tunnel insulating film 131, a charge accumulating film 132, and a block insulating film 133 that are laminated between the semiconductor layer 120 and the conductive layers 110. The tunnel insulating film 131 and the block insulating film 133 are insulating films of the likes of silicon oxide (SiO2), for example. The charge accumulating film 132 is a film capable of accumulating a charge, of the likes of silicon nitride (SiN), for example.

The semiconductor layer 113 (FIG. 2) functions as the channel region of the source select transistor STS, for example. A gate insulating film 119 is provided in an outer circumferential surface of the semiconductor layer 113. The semiconductor layer 113 is a semiconductor layer of the likes of single crystal silicon (Si), for example. The gate insulating film 119 is an insulating film of the likes of silicon oxide, for example.

The semiconductor layer 114 is a semiconductor layer of the likes of polycrystalline silicon (Si) including an N type impurity such as phosphorus, for example.

The plurality of conductive layers 110, each being a substantially plate-like conductive layer extending in the X direction and the Y direction, are arranged in the Z direction via insulating layers 101 of the likes of silicon oxide. These conductive layers 110 have a plurality of through-holes formed in a certain pattern therein, and insides of these through-holes are respectively provided with the memory structures 100. Moreover, an end section in the X direction of the conductive layer 110 is provided with a contact section 111 connected to the contact 140. The conductive layer 110 includes the likes of a laminated film of titanium nitride (TiN) and tungsten (W), for example.

Some of the conductive layers 110a respectively function as the word lines WL (FIG. 1) and as gate electrodes of the plurality of memory cells MC (FIG. 1) connected to these word lines WL.

The conductive layer 110b provided above the conductive layers 110a functions as the drain select gate line SGD (FIG.

1) and as gate electrodes of the plurality of drain select transistors STD (FIG. 1) connected to this drain select gate line SGD. A width in the Y direction of the conductive layer 110b is smaller than that of the conductive layer 110a. An insulating section SHE of the likes of silicon oxide is provided between conductive layers 110b adjacent in the Y direction.

The conductive layer 110c provided below the conductive layers 110a functions as the source select gate line SGS (FIG. 1) and as gate electrodes of the plurality of source select transistors STS (FIG. 1) connected to this source select gate line SGS. The conductive layer 110c covers the outer circumferential surface of the semiconductor layer 113 via the gate insulating film 119.

The contacts 140 extend in the Z direction, and are connected to the contact sections 111 of the plurality of conductive layers 110. The contact 140 includes the likes of a laminated film of titanium nitride (TiN) and tungsten (W), for example.

The wiring 150 functions as the bit line BL. The plurality of wirings 150, each extending in the Y direction, are arranged in the X direction. The wirings 150 are connected to the plurality of memory structures 100 via contacts 151.

Figure 4:
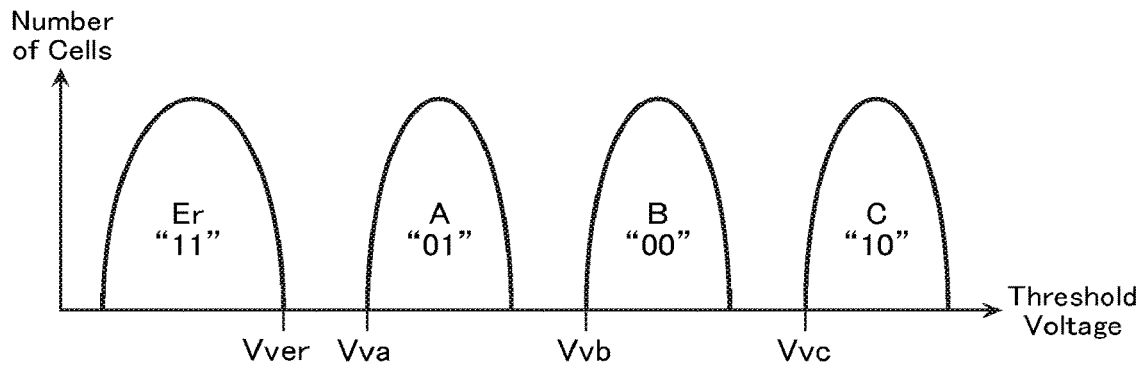
FIG. 4 is a view showing a distribution of threshold voltages of memory cells MC.

Next, threshold voltages of the memory cells MC will be described. FIG. 4 is a view showing a relationship between threshold voltages of the memory cells MC and number of cells. When the write operation has been performed on the memory cell MC, the threshold voltage of the memory cell MC depends on a quantity of electrons or holes accumulated in the charge accumulating film 132 of the memory cell MC. In this example, four types of threshold distributions are formed. In order from that of lowest threshold voltage, distributions Er, A, B, C are formed, and the memory cells MC corresponding to these distributions are assigned with, for example, data "11", "01", "00", "10". The distribution Er is an erase level of lowest threshold level, and, in it, holes are accumulated in the charge accumulating film 132. Thereafter, in order of least number of electrons held in the charge accumulating film 132, the distributions A, B, C are formed. Note that these distributions will also be referred to below as levels Er, A, B, C. Moreover, a voltage Vver of maximum value of the threshold voltage of level Er indicates an erase verify voltage during the erase operation, and voltages Vva, Vvb, Vvc of minimum values of the threshold voltages of levels A, B, C respectively indicate program verify voltages during write operations of levels A, B, C. The erase verify voltage Vver is a negative voltage lower than 0 V. The program verify voltages Vva, Vvb, Vvc are positive voltages larger than 0 V.

[Operation]

Next, the write operation of data and the data erase operation of the memory cells MC of the semiconductor memory device configured in this way, will be described. In this kind of semiconductor memory device, write of data to the memory cells MC is executed by a page write operation in units of the word line WL, and data erase from the memory cells MC is executed by a flash erase operation that erases data of the memory cells MC in the memory block MB simultaneously.

Figure 5A:
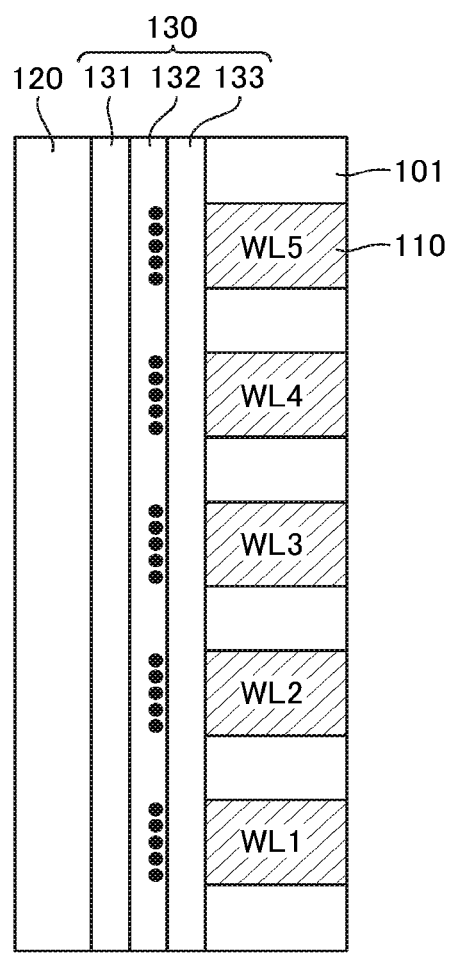
FIGS. 5A and 5B are schematic cross-sectional views showing states of carriers after data write and after data erase of the semiconductor memory device.
Figure 5B:
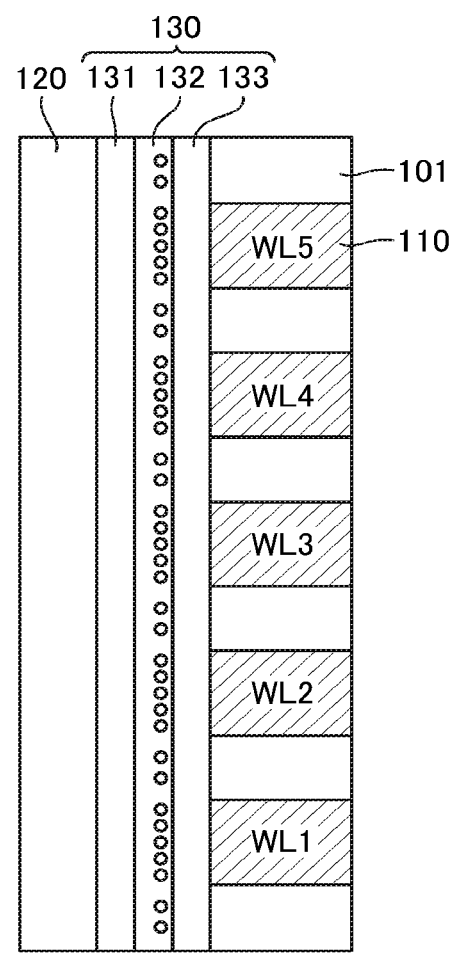

FIGS. 5A and 5B show states of carriers after data write and after data erase of the memory cells MC. As shown in FIG. 5A, in the page write operation, the program voltage Vpgm is applied only to the word line WL that has been selected in order from a lower side, of the plurality of word lines WL. As a result, the electrons supplied to the channel of the semiconductor layer 120 tunnel through the tunnel insulating film 131 to concentrate in close proximity to the selected word line WL in the charge accumulating film 132. On the other hand, as shown in FIG. 5B, in the flash erase operation, the erase voltage Vera is applied between all of the word lines WL and the semiconductor layer 120. As a result, the holes supplied to the semiconductor layer 120 move and diffuse to inter-memory cell portions in the charge accumulating film 132.

Therefore, if the page write operation and the flash erase operation are repeated, then holes will gather in the inter-memory cell portions of the charge accumulating film 132, as shown in FIG. 5B. If holes remain in the inter-memory cell portions of the charge accumulating film 132, then HTDR (High Temperature Data Retention) characteristics or NWI (Neighbor Word-line Interference) characteristics will deteriorate. On the other hand, if electrons remain in the inter-memory cell portions of the charge accumulating film 132, then these electrons will act to raise the threshold of the memory cell. As a result, there is a risk that a read failure where, for example, the erase level is mistaken for the A level, occurs. Therefore, it is desirable that, as far as possible, carriers do not remain in the charge accumulating film 132 between the word lines WL.

Accordingly, the semiconductor memory device of the present embodiment comprises an erase mode that performs an erase operation by which carriers do not remain in the charge accumulating film 132 between the word lines WL.

Figure 6:
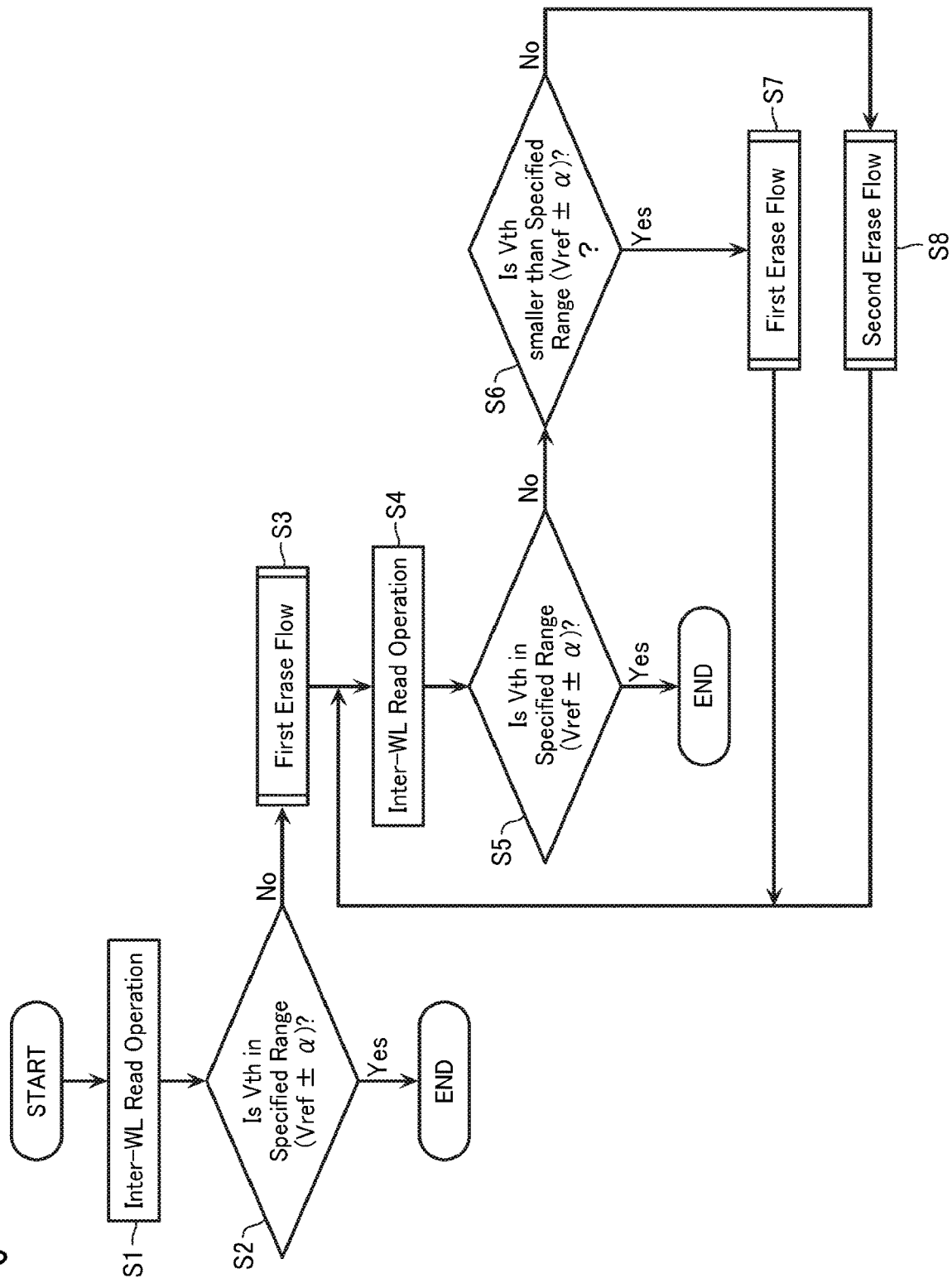
FIG. 6 is a flowchart showing an erase operation of the semiconductor memory device according to the first embodiment.

FIG. 6 is a flowchart showing the erase operation of the above-described erase mode according to the present embodiment. This erase operation is executed in a state where the memory cells MC in the memory block MB have been erased simultaneously by flash erase, for example. The above-described flash erase may be incorporated with a program (a pre-program) performed simultaneously on the memory cells MC in a preceding stage thereof. In this erase operation, a later-mentioned inter-word line read operation is performed, and then, based on a read result thereof, a first erase flow (S3, S7) that performs erase so as to inject electrons into the charge accumulating film 132 between the word lines WL is executed. Moreover, as shown in FIG. 6, a second erase flow (S8) that performs erase so as to inject holes into the charge accumulating film 132 between the word lines WL, may be combined, after the first erase flow. In the present embodiment, an erase operation by which carriers do not remain in the charge accumulating film 132 between the word lines WL is executed by combining the first erase flow and the second erase flow.

This erase mode may be performed when input of a command of the erase mode related to the present embodiment separate from an ordinary flash erase command, has been received. Moreover, this processing may be performed immediately after the flash erase operation, or may be performed on an erase-completed memory block MB at a fixed timing or an arbitrary timing, as a background processing.

Note that in the present embodiment, as will be mentioned later, a word line WL-odd that is odd-numbered counting from the bottom word line WL in a stripe erase operation executed by the first erase flow corresponds to a "first conductive layer", and a word line WL-even that is even-numbered counting from the bottom word line WL in the stripe erase operation executed by the first erase flow corresponds to a "second conductive layer". Moreover, a word line WL-odd that is odd-numbered counting from the bottom word line WL in a stripe write operation executed by the second erase flow corresponds to a "third conductive layer", and a word line WL-even that is even-numbered counting from the bottom word line WL in the stripe write operation executed by the second erase flow corresponds to a "fourth conductive layer". However, this correspondence relationship is one example, and it is also possible for the "first conductive layer" and "third conductive layer" to be corresponded to by the word line WL-even, and for the "second conductive layer" and "fourth conductive layer" to be corresponded to by the word line WL-odd. Moreover, in the present embodiment, the "first conductive layer" is the same as the "third conductive layer", but may be the same as the "fourth conductive layer". Moreover, in the present embodiment, the "second conductive layer" is the same as the "fourth conductive layer", but may be the same as the "third conductive layer".

Moreover, adjacent two word lines WL2, WL3 in the later-mentioned inter-word line read operation respectively correspond to a "fifth conductive layer" and a "sixth conductive layer".

Moreover, in the description below, a voltage applied to a word line WL is described, but this voltage may be replaced by a voltage applied to the wiring CG (FIG. 1) electrically connected to the word line WL. Moreover, voltages applied to a bit line BL and a semiconductor layer 120 may be respectively replaced by voltages applied to other wirings electrically connected directly, or via another circuit, to the bit line BL and the semiconductor layer 120.

Figure 7:
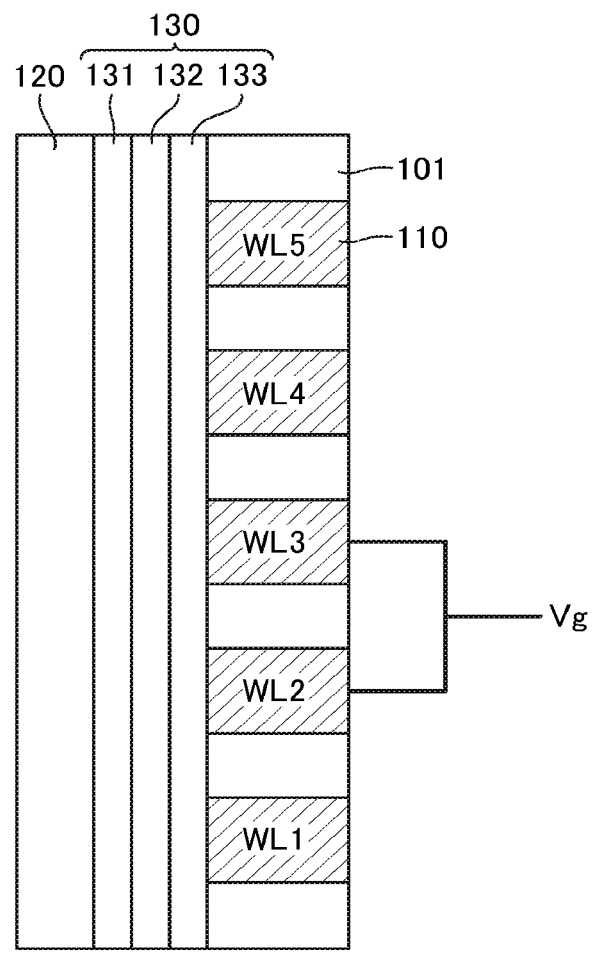
FIG. 7 is a schematic cross-sectional view for explaining an inter-word line read operation of same semiconductor memory device.

In FIG. 6, first, the inter-word line read operation is executed (S1). FIG. 7 is a schematic cross-sectional view for explaining this inter-word line read operation.

The above-described inter-word line read operation is an operation for determining a carrier present between the word lines WL. For example, as shown in FIG. 7, a read voltage Vg is applied to adjacent two or more arbitrary word lines, in this example, the word lines WL2, WL3. By changing this read voltage Vg to determine a level of a value Vth of the read voltage Vg when a certain current value Ith has flowed in the semiconductor layer 120, presence/absence and kind of the carrier between the word lines WL can be estimated. This voltage value Vth will be called a threshold voltage.

FIG. 8A is a view showing a state where holes are remaining between the word lines WL in an erased state. FIG. 8B is a view showing a state where carriers are not present between the word lines WL in an erased state. FIG. 8C is a view showing a state where electrons are remaining between the word lines WL in an erased state.

Figure 9:
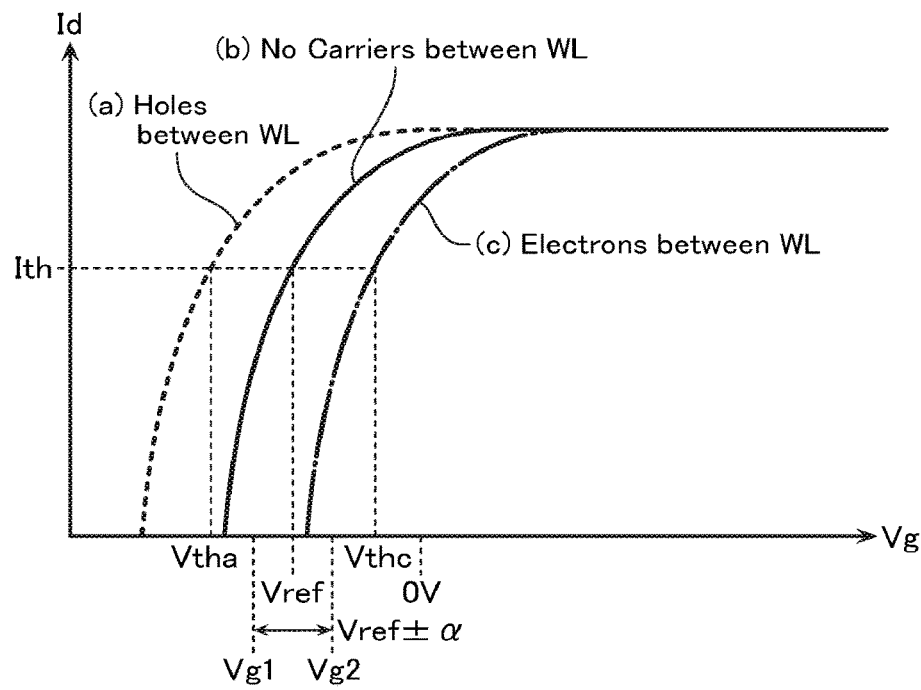
FIG. 9 is a graph showing a relationship of a state of carriers and a read voltage and read current during the inter-word line read operation in same semiconductor memory device.

When the inter-word line read operation is performed for each of these three states, read voltage Vg-drain current Id characteristics of the kind shown in FIG. 9 are obtained. FIG. 9 is a graph showing a relationship of the state of carriers and the read voltage and read current during the inter-word line read operation. Now, the threshold voltage Vth of the read voltage Vg at which the current value Ith flows in case (b) of there not being carriers between the word lines WL, is assumed to be a reference voltage Vref. In reality, there is some variation, therefore if the threshold voltage Vth is within a specified range Vref±α (where α is, for example, 0.1 V), it can be estimated that carriers are not present between the word lines WL. In case (a) where holes are remaining between the word lines WL, a threshold voltage Vtha of the read voltage Vg at which a drain current Id of the current value Ith flows, will be smaller than the specified range Vref±α. On the other hand, in case (c) where electrons are remaining between the word lines WL, a threshold voltage Vthc of the read voltage Vg at which a drain current Id of the current value Ith flows, will be smaller than a first threshold (0 V) for identifying whether or not the memory cell MC is at the Er level, but will be larger than the specified range Vref±α. Accordingly, it is determined by the later-mentioned inter-word line read operation whether the threshold voltage Vth is smaller than the specified range Vref±α, is within the specified range Vref±α, or is larger than the specified range Vref±α.

Figure 10:
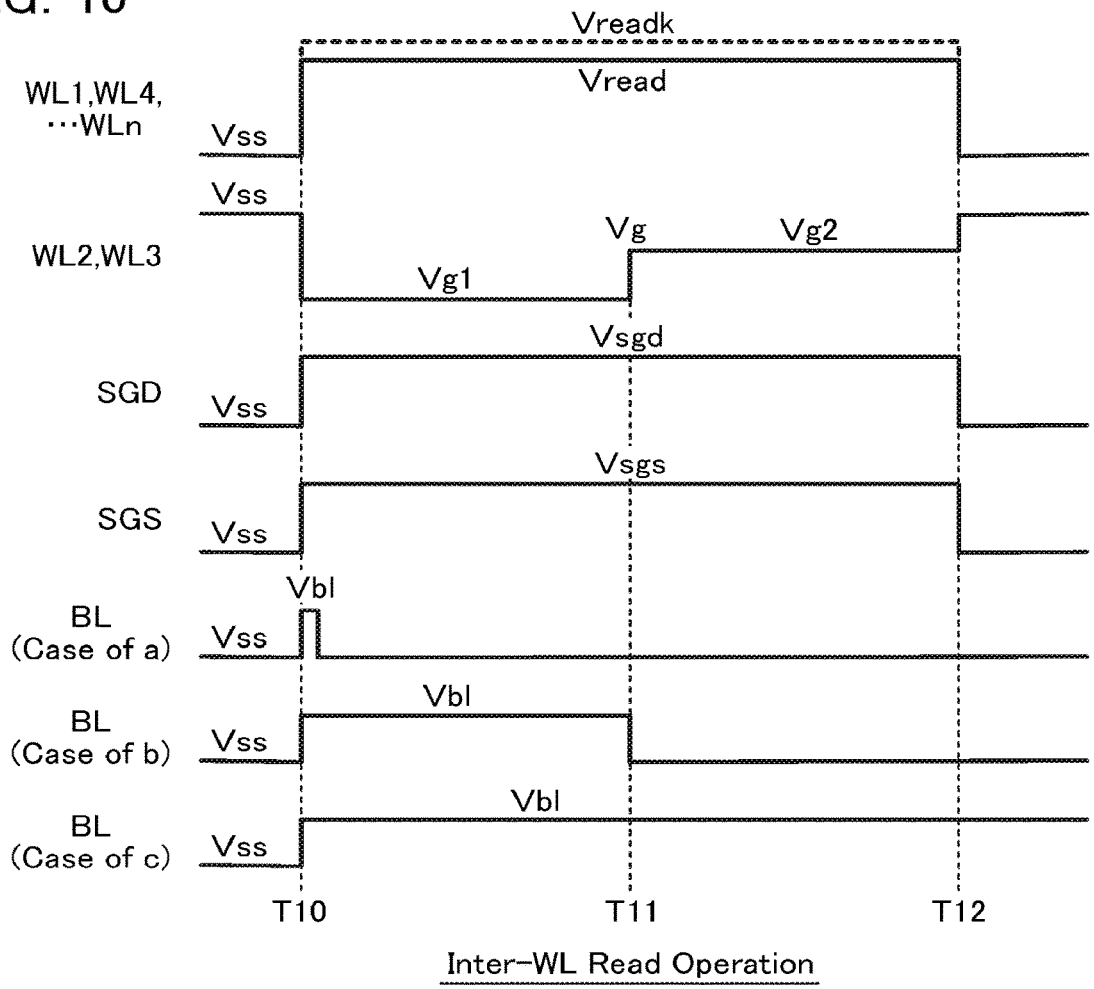
FIG. 10 is a waveform chart showing applied voltages of each of sections during the inter-word line read operation in same semiconductor memory device.

FIG. 10 is a waveform chart showing one example of this inter-word line read operation. At time T10, a voltage Vread is applied to word lines WL1, WL4, ..., WLn. The voltage Vread is a positive voltage value at which all of the memory cells MC attain an ON state. Moreover, the word lines WL2, WL3 are applied with the read voltage Vg changing in two stages. That is, the word lines WL2, WL3 are applied with a voltage value Vg1 being a first read voltage from time T10 to time T11, and are applied with a voltage value Vg2 being a second read voltage from time T11 to time T12. The voltage values Vg1, Vg2 are respectively set to a lower limit value and an upper limit value of the specified range Vref±α, for example. That is, the voltage value Vg1 is, for example, a voltage value Vref−α, and the voltage value Vg2 is, for example, a voltage value Vref+α. Setting is made such that Vg1<Vg2<Vss=0 V. The bit line BL is applied with a certain bit line voltage Vbl, and the select gate lines SGD, SGS are applied with voltages Vsgd, Vsgs at which the select transistors STD, STS attain an ON state.

Note that a configuration may be adopted whereby the word lines WL1, WL4 adjacent to the read target word lines WL2, WL3 are applied with a read voltage Vreadk (refer to FIG. 10) slightly higher than the read voltage Vread applied to the other word lines WL5, ..., WLn.

In the case where holes are remaining between the word lines WL, the memory cells MC connected to the word lines WL2, WL3 attain an ON state and the voltage of the bit line BL drops at a time point when the voltage value Vg1 is applied to the word lines WL2, WL3. Therefore, the threshold voltage Vth can be estimated to be smaller than the specified range (the case of a). In the case where no carriers are remaining between the word lines WL, the memory cells MC connected to the word lines WL2, WL3 attain an ON state and the voltage of the bit line BL drops at a time point (T11) when the voltage value Vg2 is applied to the word lines WL2, WL3. Therefore, the threshold voltage Vth can be estimated to be within the specified range (the case of b). Furthermore, in the case where electrons are remaining between the word lines WL, the memory cells MC connected to the word lines WL2, WL3 are not turned ON even after the voltage value Vg2 has been applied to the word lines WL2, WL3. Therefore, the voltage of the bit line BL is maintained. As a result, the threshold voltage Vth can be estimated to be larger than the specified range (the case of c). Note that in a state where the memory cells MC in the memory block MB have been erased simultaneously, in such cases as when the inter-word line read operation of step S1 of FIG. 6 is performed immediately after the flash erase, there is no need to consider an aspect of (c) where electrons are present between the word lines WL. Therefore, in reality, the read operation shown in FIG. 10 can be replaced by a read operation where only the voltage value Vg1 is applied to the word lines WL2, WL3.

In the present embodiment, a configuration may be adopted whereby the reference voltage Vref or voltage values Vg1, Vg2 at a time of the inter-word line read operation are calculated by the likes of a calibration in an initial state where carriers have not once been injected between the word lines WL, and these calculated reference voltage Vref or voltage values Vg1, Vg2 are stored in the device as control values. Moreover, when the reference voltage Vref or voltage values Vg1, Vg2 are calculated by the above-described calibration, the numbers of the plurality of word lines WL that have been set as read targets are also stored as the above-described control values. Moreover, a configuration may be adopted whereby the above-described inter-word line read operation is performed adopting as read targets the same word lines WL as the plurality of word lines WL that underwent the calibration, referring to the above-described control values.

Next, as shown in FIG. 6, it is determined whether or not the acquired threshold voltage Vth is within the specified range (for example, Vref±α) (S2). More specifically, a configuration may be adopted whereby determination is made based on whether or not as a result of the above-mentioned two-stage read operation, a majority (for example, 80% or more) of the memory units MU are within the specified range, for example. If the threshold voltage Vth is within the specified range, then processing ends, and if the threshold voltage Vth is outside the specified range, then the first erase flow is executed (S3). This stage presupposes the state where the memory cells MC in the memory block MB have been erased simultaneously by the flash erase, hence when the threshold voltage Vth is outside the specified range, it is estimated that holes are remaining between the word lines. Therefore, the first erase flow to inject electrons between the word lines is executed.

Figure 11:
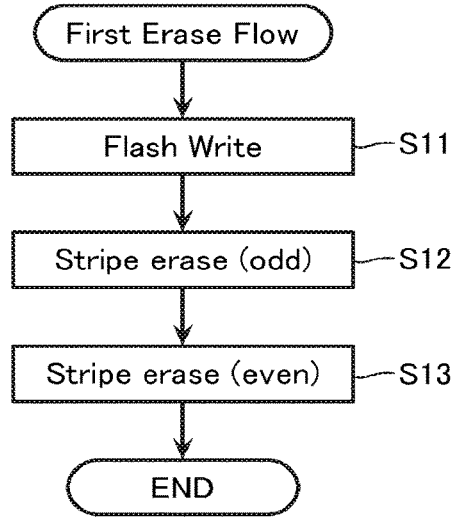
FIG. 11 is a flowchart showing a first erase flow of same semiconductor memory device.

FIG. 11 is a flowchart of the first erase flow. In the first erase flow, a flash write operation corresponding to a "first write operation" is executed (S11), then a stripe erase operation on the odd-numbered word lines WL corresponding to a "first erase operation" is executed (S12), after which a stripe erase operation on the even-numbered word lines WL corresponding to a "second erase operation" is executed (S13).

In the flash write operation (S11), a program voltage is applied to all of the word lines WL in the memory block MB to write data of a certain level, for example, level C of highest threshold to all of the memory cells MC. The reason for performing write of level C is in order to inject more electrons between the word lines WL.

Figure 12:
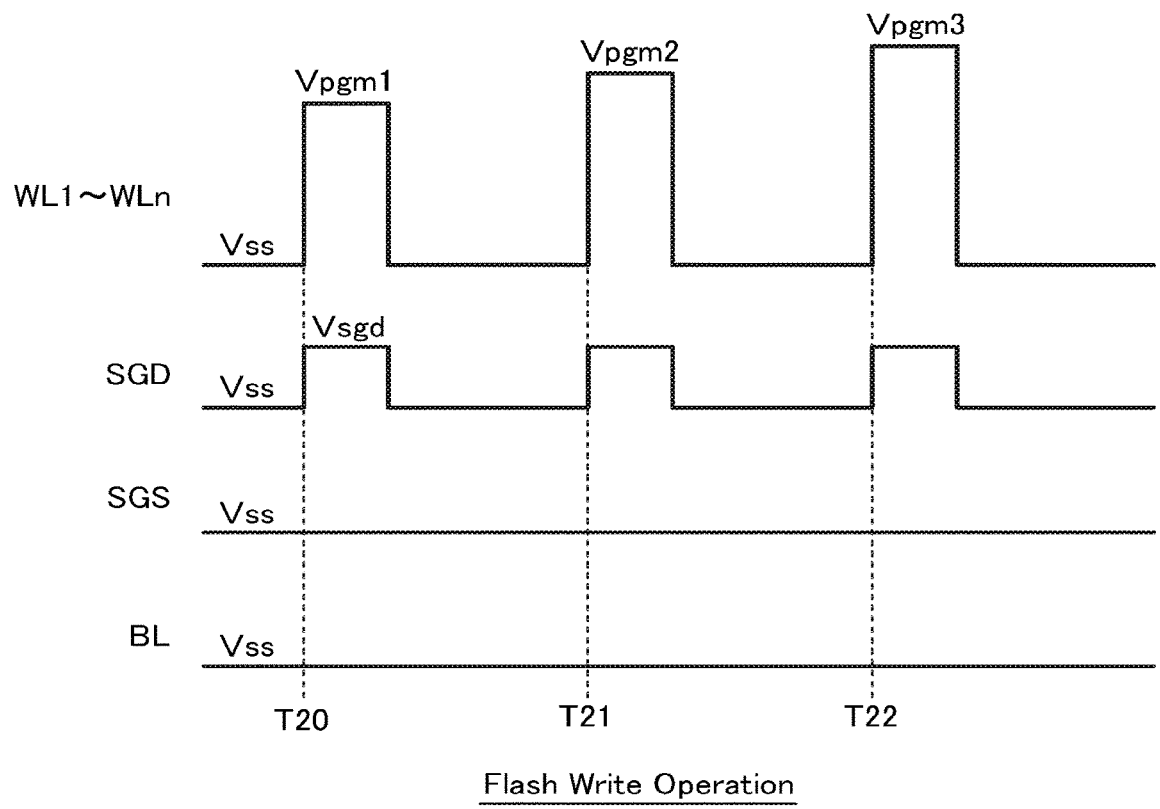
FIG. 12 is a waveform chart showing applied voltages of each of sections of the first erase flow of same semiconductor memory device.

FIG. 12 is a waveform chart showing applied voltages of each of sections in the flash write operation (S11). At time T20, a program voltage Vpgm1 of level C is applied to all of the word lines WL1-WLn. At this time, the bit line BL is applied with Vss (for example, 0 V), and the drain select gate line SGD is applied with the voltage Vsgd at which the select transistor STD is turned ON. At following time T21, a second time of the write operation is performed. A program voltage Vpgm2 slightly larger than the program voltage Vpgm1 is applied to all of the word lines WL1-WLn. At following time T22, a third time of write is performed. A program voltage Vpgm3 slightly larger than the program voltage Vpgm2 is applied to all of the word lines WL1-WLn. In this flash write operation, threshold voltages of each of the memory cells MC are not finely controlled, since an object of the flash write operation is injection of electrons to between the word lines WL. However, a configuration may be adopted whereby after application of each of the program voltages Vpgm1, Vpgm2, Vpgm3, a program verify operation is performed to finely control the thresholds. Moreover, the number of times that the program voltage is applied may be arbitrarily set.

Figure 13:
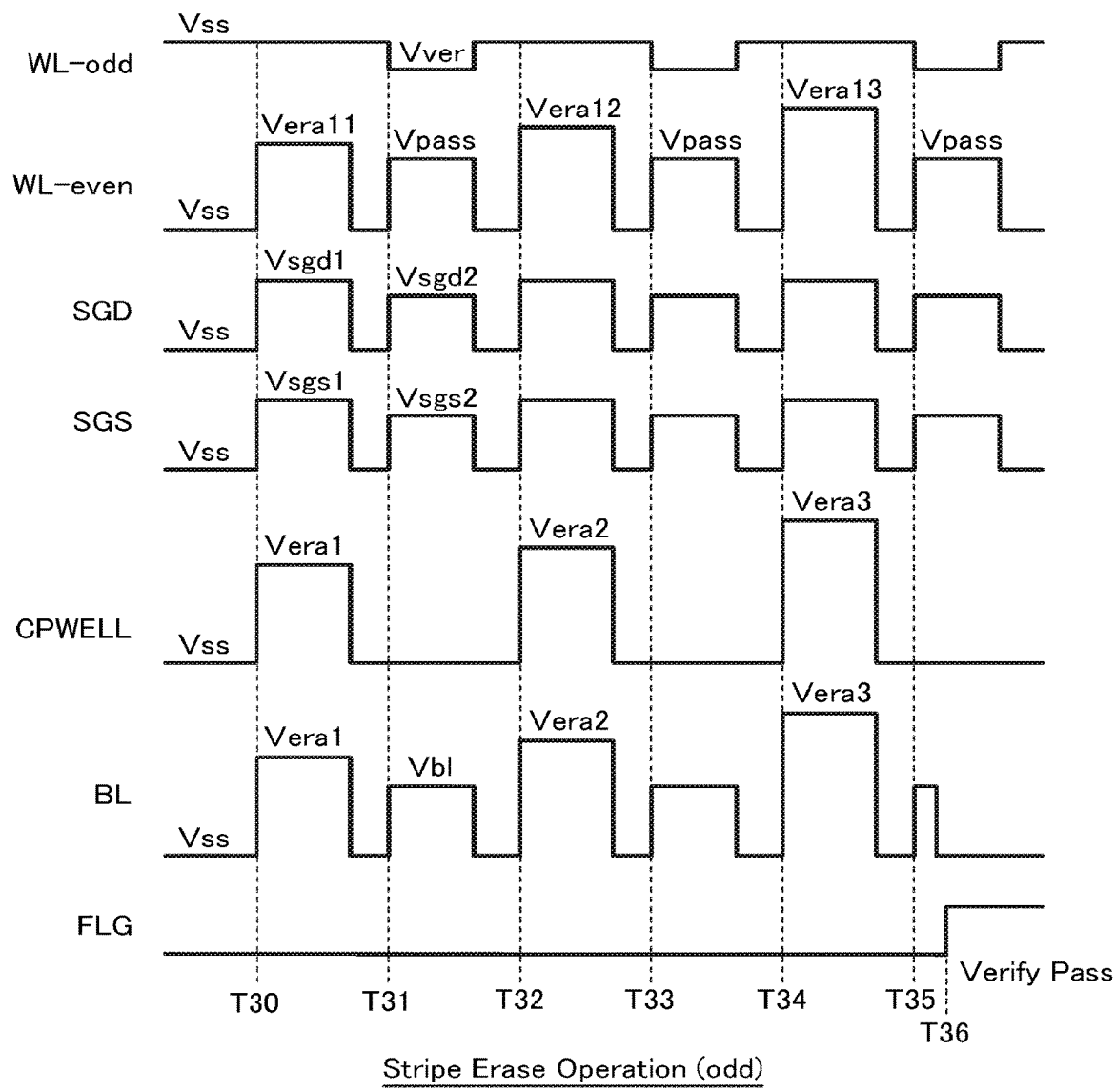
FIG. 13 is a waveform chart showing applied voltages of each of sections of the first erase flow of same semiconductor memory device.

FIG. 13 is a waveform chart showing the stripe erase operation on the odd-numbered word lines WL (S12). At time T30, the odd-numbered word lines WL-odd are applied with Vss being a first voltage, for example, 0 V, and the even-numbered word lines WL-even that are not to undergo erase are applied with a voltage Vera11 slightly smaller than an erase voltage Vera1. The bit line BL and an unillustrated contact connected to an unillustrated well wiring CPWELL are applied with the erase voltage Vera1. Moreover, the select gate line SGD is applied with a voltage Vsgd1 of a degree at which a GIDL (Gate Induced Drain Leakage) current will occur in the select transistor STD, and the select gate line SGS is applied with a voltage Vsgs1 at which the select transistor STS is turned ON to enable injection of holes from a substrate side. As a result, holes are injected from a substrate S side and a bit line BL side into the channel formed in the semiconductor layer 120, and holes are injected via the tunnel insulating film 131 into the charge accumulating film 132 opposing the odd-numbered word lines WL-odd. Next, from time T31, an erase verify operation begins. The odd-numbered word lines WL-odd are applied with the erase verify voltage Vver slightly smaller than Vss, and the even-numbered word lines WL-even are applied with a pass voltage Vpass at which the memory cells MC are turned ON. The certain bit line voltage Vbl is applied to the bit line BL, and voltages Vsgd2, Vsgs2 at which the select transistors STD, STS are turned ON are respectively applied to the select gate lines SGD, SGS. Unless there is pass of verify, the bit line voltage Vbl will be maintained. In this case, at time T32, a second time of the stripe erase operation is executed. That is, the odd-numbered word lines WL-odd are maintained at Vss, and a voltage Vera12 slightly smaller than an erase voltage Vera2 is applied to the even-numbered word lines WL-even. Moreover, the erase voltage Vera2 slightly larger than the erase voltage Vera1 is applied to the bit line BL and the well wiring CPWELL. At following time T33 too, an erase verify operation similar to that described above is executed. At times T34, T35, third times of the erase operation and erase verify operation are performed, and at time T36, when verify has been passed, a verify pass flag FLG rises, and the odd-numbered stripe erase operation ends.

Figure 14:
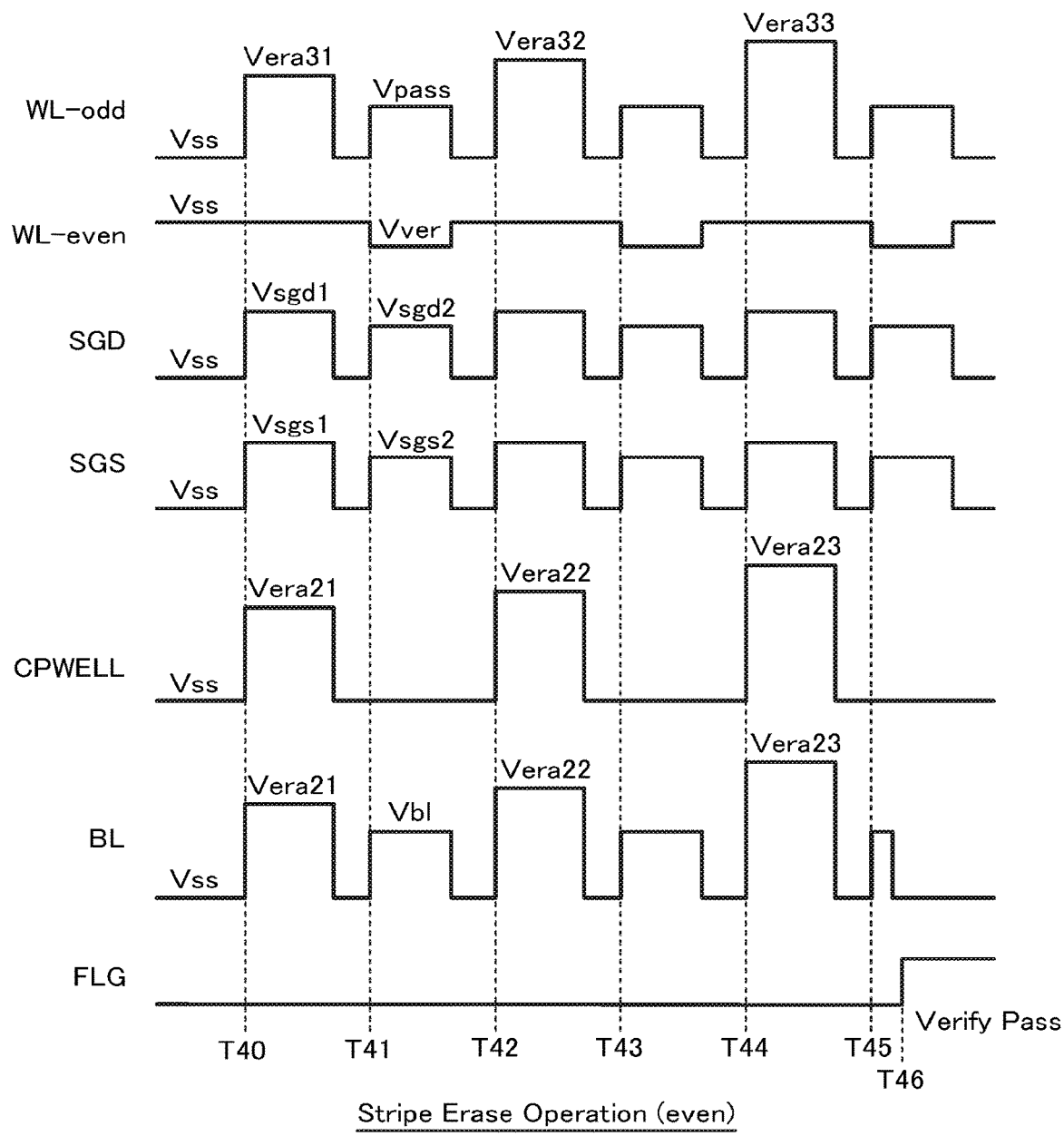
FIG. 14 is a waveform chart showing applied voltages of each of sections of the first erase flow of same semiconductor memory device.

FIG. 14 is a waveform chart showing the stripe erase operation on the even-numbered word lines WL (S13). At time T40, the erase-completed odd-numbered word lines WL-odd are applied with a voltage Vera31 slightly smaller than an erase voltage Vera21, and the even-numbered word lines WL-even that are to undergo erase are applied with Vss being the first voltage, for example, 0 V. The bit line BL and the unillustrated contact connected to the unillustrated well wiring CPWELL are applied with the erase voltage Vera21. Moreover, the select gate lines SGD, SGS are applied with the voltages Vsgd1, Vsgs1 similar to those applied during odd-numbered stripe erase. As a result, holes are injected from the substrate S side and the bit line BL side into the channel formed in the semiconductor layer 120, and holes are injected via the tunnel insulating film 131 into the charge accumulating film 132 opposing the even-numbered word lines WL-even. Next, from time T41, an erase verify operation begins. The even-numbered word lines WL-even are applied with the erase verify voltage Vver slightly smaller than Vss, and the odd-numbered word lines WL-odd are applied with the pass voltage Vpass at which the memory cells MC are turned ON. The certain bit line voltage Vbl is applied to the bit line BL, and the voltages Vsgd2, Vsgs2 at which the select transistors STD, STS are turned ON are respectively applied to the select gate lines SGD, SGS. Unless there is pass of verify, the bit line voltage Vbl will be maintained. In this case, at time T42, a second time of the stripe erase operation is performed. That is, the even-numbered word lines WL-even are maintained at Vss, and a voltage Vera32 slightly smaller than an erase voltage Vera22 is applied to the odd-numbered word lines WL-odd. Moreover, the erase voltage Vera22 slightly larger than the erase voltage Vera21 is applied to the bit line BL and the well wiring CPWELL. At following time T43 too, an erase verify operation similar to that described above is executed. At times T44, T45, third times of the erase operation and erase verify operation are performed, and at time T46, when verify has been passed, a verify pass flag FLG rises, and the even-numbered stripe erase operation ends.

FIGS. 15A to 15C and FIGS. 16A to 16C schematically show states of carriers of the charge accumulating film 132 after these flash write operation (S11) and stripe erase operations (S12, S13) have been executed.

In the flash write operation (S11), the program voltage Vpgm is applied to all of the word lines WL. Therefore, electrons move from the channel side also to the charge accumulating film 132 between the word lines WL. As a result of which, after the flash erase operation, the holes that had been remaining in the charge accumulating film 132 between the word lines WL can be canceled out by the electrons that have newly moved in, and a level C write state where carriers do not remain in the charge accumulating film 132 between the word lines WL can be achieved, as shown in FIG. 15A.

In this state, if the erase operation is performed for the memory cells MC corresponding to the odd-numbered word lines WL-odd, then, as shown in FIG. 15B, holes concentrate in the charge accumulating film 132 opposing the odd-numbered word lines WL-odd. Similarly, if the erase operation is performed for the memory cells MC corresponding to the even-numbered word lines WL-even, then, as shown in FIG. 15C, holes concentrate in the charge accumulating film 132 opposing the even-numbered word lines WL-even.

As a result, an erase operation in a state where carriers are not present between the word lines WL becomes possible.

The above is the description of the state of carriers in the case where an ideal first erase flow has been performed. If, in the flash write operation (S11), electrons are provisionally injected in surplus into the charge accumulating film 132, as shown in FIG. 16A, then electrons will end up remaining between the word lines WL. In this case, even if the following stripe erase operations (S12, S13) are executed, electrons will end up remaining in the charge accumulating film 132 between the word lines WL, as shown in FIGS. 16B and 16C. Moreover, in the case where, contrarily, in the flash write operation (S11), electrons are not sufficiently supplied to the charge accumulating film 132, holes will end up remaining between the word lines WL, even if the following stripe erase operations (S12, S13) are executed.

Accordingly, as shown in FIG. 6, when the first erase flow (S3) has ended, the inter-word line read operation is executed again (S4), and presence/absence of carriers between the word lines WL determined. If the threshold voltage Vth is within the specified range, then processing ends (S5: Yes), and if the threshold voltage Vth is not within the specified range, then a determination of whether or not the threshold voltage Vth is smaller than the specified range, is performed (S6). If the threshold voltage Vth is smaller than the specified range, then the above-mentioned first erase flow is repeated (S7). Moreover, if the threshold voltage Vth is larger than the specified range, then the second erase flow is executed (S8).

Figure 17:
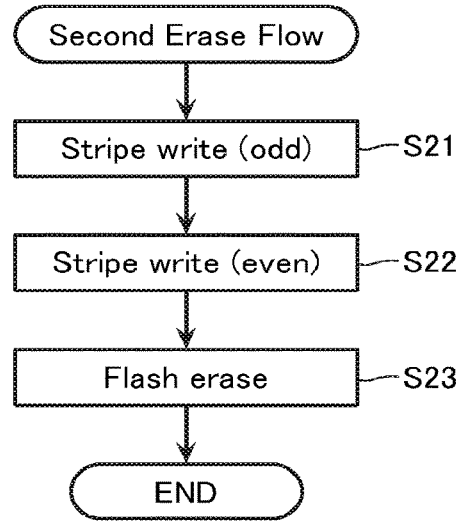
FIG. 17 is a flowchart showing a second erase flow of same semiconductor memory device.

FIG. 17 is a flowchart of the second erase flow. In the second erase flow, an odd-numbered stripe write operation corresponding to a "second write operation" is executed (S21), then an even-numbered stripe write operation corresponding to a "third write operation" is executed (S22), and finally a flash erase operation corresponding to a "third erase operation" is executed (S23).

In the odd-numbered stripe write operation (S21), a program voltage is applied to the odd-numbered word lines WL-odd in the memory block MB to write data of a certain level, for example, level C to the odd-numbered memory cells MC. In the even-numbered stripe write operation (S22), a program voltage is applied to the even-numbered word lines WL-even in the memory block MB to write data of a certain level, for example, level C to the even-numbered memory cells MC. Now, data written to the memory cells MC may be data of other than level C, and the program voltage applied to the word lines WL in the stripe write operations (S21, S22) may be the same voltage value as, or may be a different voltage value from the program voltage applied to the word lines WL in the flash write operation (S11) in the first erase flow.

Figure 18:
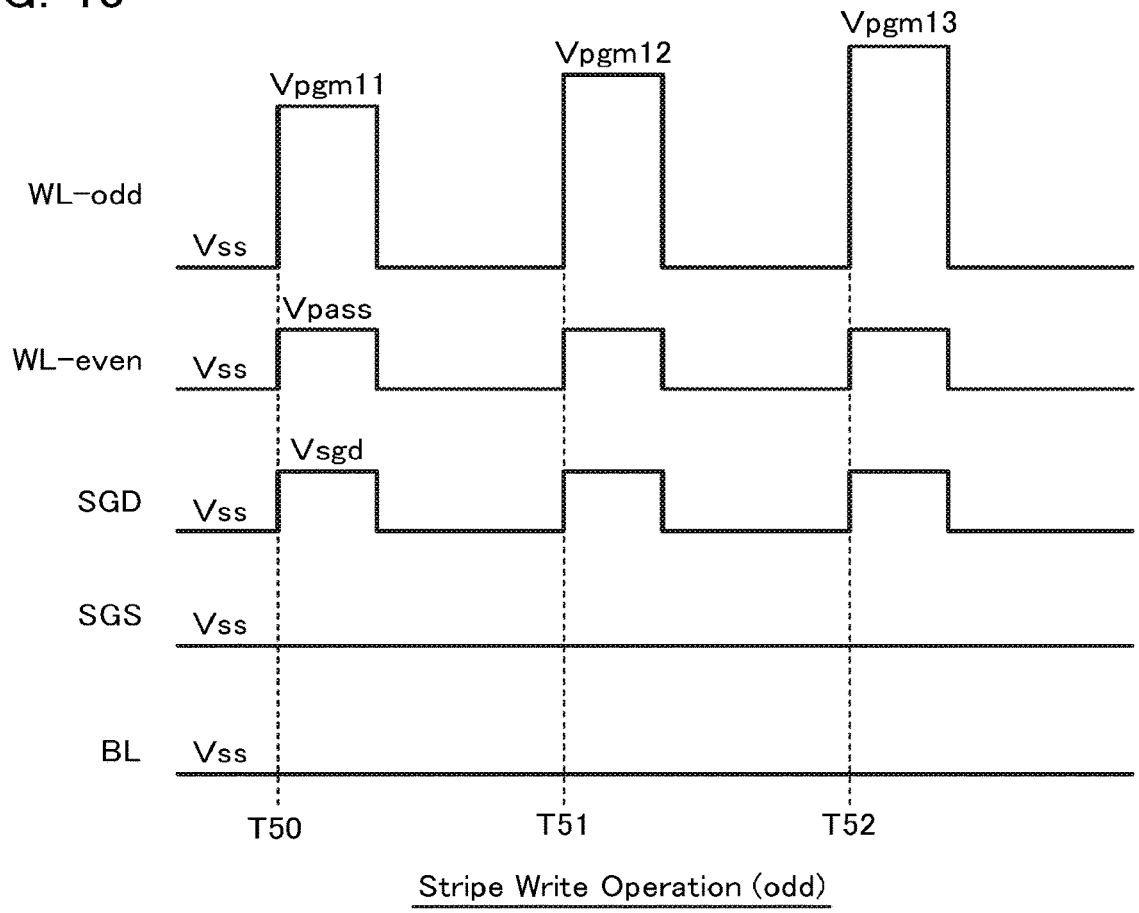
FIG. 18 is a waveform chart showing applied voltages of each of sections of the second erase flow of same semiconductor memory device.

FIG. 18 is a waveform chart showing the odd-numbered stripe write operation (S21). At time T50, a program voltage Vpgm11 is applied to the odd-numbered word lines WL-odd, and the even-numbered word lines WL-even are applied with the pass voltage Vpass at which the memory cells MC are turned ON. The bit line BL is applied with Vss, and the select gate line SGD is applied with the voltage Vsgd at which the select transistor STD is turned ON. At following time T51, a second time of the write operation is performed. A program voltage Vpgm12 slightly larger than the program voltage Vpgm11 is applied to the odd-numbered word lines WL-odd. At following time T52, a third time of write is performed. A program voltage Vpgm13 slightly larger than the program voltage Vpgm12 is applied to the odd-numbered word lines WL-odd.

Figure 19:
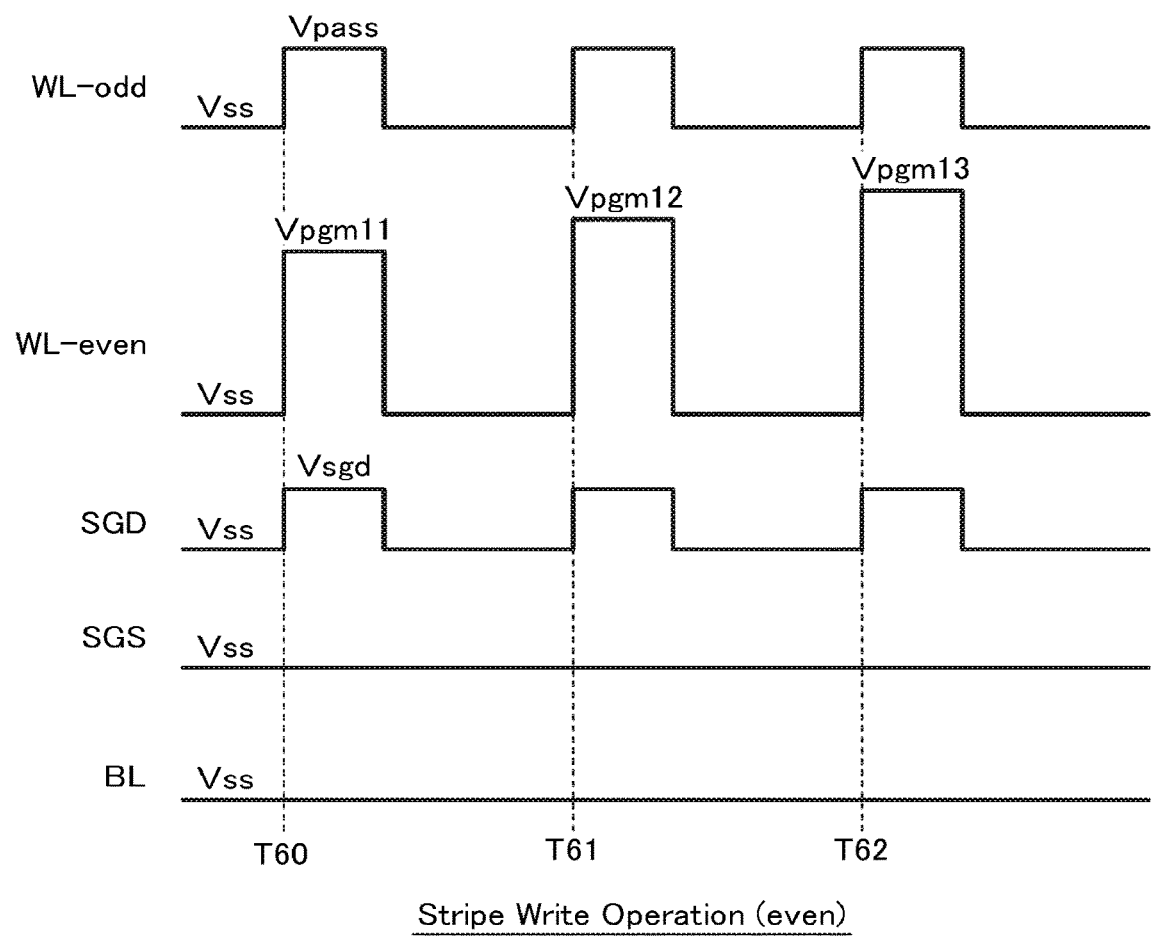
FIG. 19 is a waveform chart showing applied voltages of each of sections of the second erase flow of same semiconductor memory device.

FIG. 19 is a waveform chart showing the even-numbered stripe write operation (S22). At time T60, the program voltage Vpgm11 is applied to the even-numbered word lines WL-even, and the odd-numbered word lines WL-odd are applied with the pass voltage Vpass at which the memory cells MC (for example, at level C) are turned ON. The bit line BL is applied with Vss, and the select gate line SGD is applied with the voltage Vsgd at which the select transistor STD is turned ON. At following time T61, a second time of the write operation is performed. The program voltage Vpgm12 slightly larger than the program voltage Vpgm11 is applied to the even-numbered word lines WL-even. At following time T62, a third time of write is performed. The program voltage Vpgm13 slightly larger than the program voltage Vpgm12 is applied to the even-numbered word lines WL-even. As a result, the even-numbered stripe write operation ends. Note that in the stripe write operations too, the number of times the program voltage is applied is arbitrary, and a configuration may be adopted whereby after application of each of the program voltages Vpgm11, Vpgm12, Vpgm13, a program verify operation is performed to finely control the threshold. Moreover, a configuration may be adopted whereby these program voltages Vpgm11, Vpgm12, Vpgm13 are adjusted to voltage values that differ slightly between the stripe write operations (S21, S22).

Figure 20:
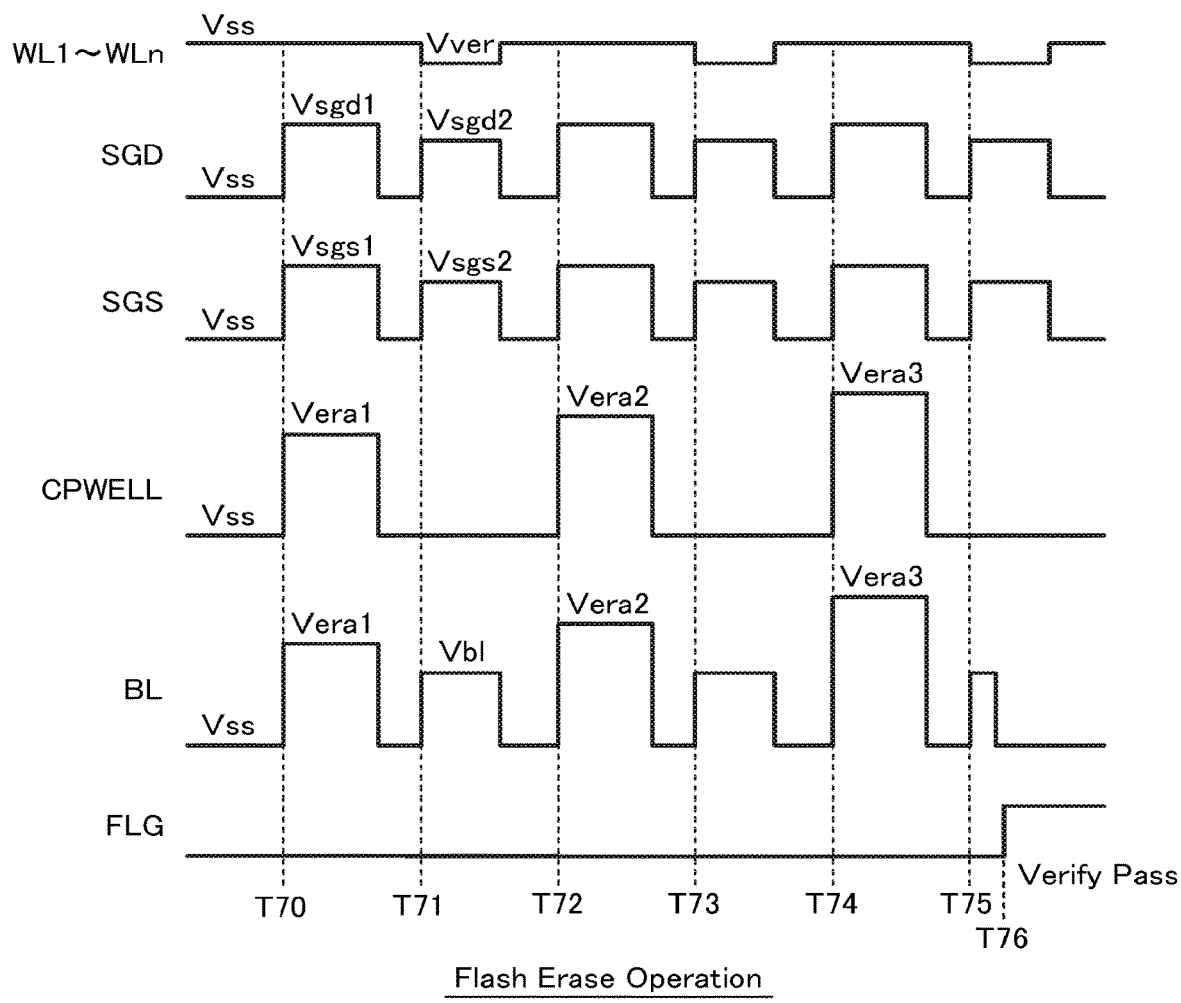
FIG. 20 is a waveform chart showing applied voltages of each of sections of the second erase flow of same semiconductor memory device.

FIG. 20 is a waveform chart showing the flash erase operation (S23). At time T70, the voltage Vss is applied to all of the word lines WL1-WLn. The bit line BL and the unillustrated contact connected to the unillustrated well wiring CPWELL are applied with the erase voltage Vera1. Moreover, the select gate line SGD is applied with the voltage Vsgd1 of a degree at which a GIDL current will occur in the select transistor STD, and the select gate line SGS is applied with a voltage Vsgs1 at which the select transistor STS is turned ON to enable injection of holes from the substrate side. As a result, holes are injected from the substrate S side and the bit line BL side into the channel formed in the semiconductor layer 120, and holes are injected via the tunnel insulating film 131 into the charge accumulating film 132 opposing all of the word lines WL1-WLn. At this time, holes are injected also into the charge accumulating film 132 between the word lines WL. Next, from time T71, an erase verify operation begins. All of the word lines WL are applied with the erase verify voltage Vver slightly smaller than the voltage Vss. The certain bit line voltage Vbl is applied to the bit line BL, and the voltages Vsgd2, Vsgs2 at which the select transistors STD, STS are turned ON are respectively applied to the select gate lines SGD, SGS. Unless there is pass of verify, the bit line voltage Vbl will be maintained. In this case, at time T72, a second time of the flash erase operation is performed. That is, Vss is applied to all of the word lines WL1-WLn. Moreover, the erase voltage Vera2 slightly larger than the erase voltage Vera1 is applied to the bit line BL and the well wiring CPWELL. At following time T73 too, an erase verify operation similar to that described above is executed. At times T74, T75, third times of the erase operation and erase verify operation are performed, and at time T76, when verify has been passed, a verify pass flag FLG rises, and the flash erase operation ends.

Figure 21:
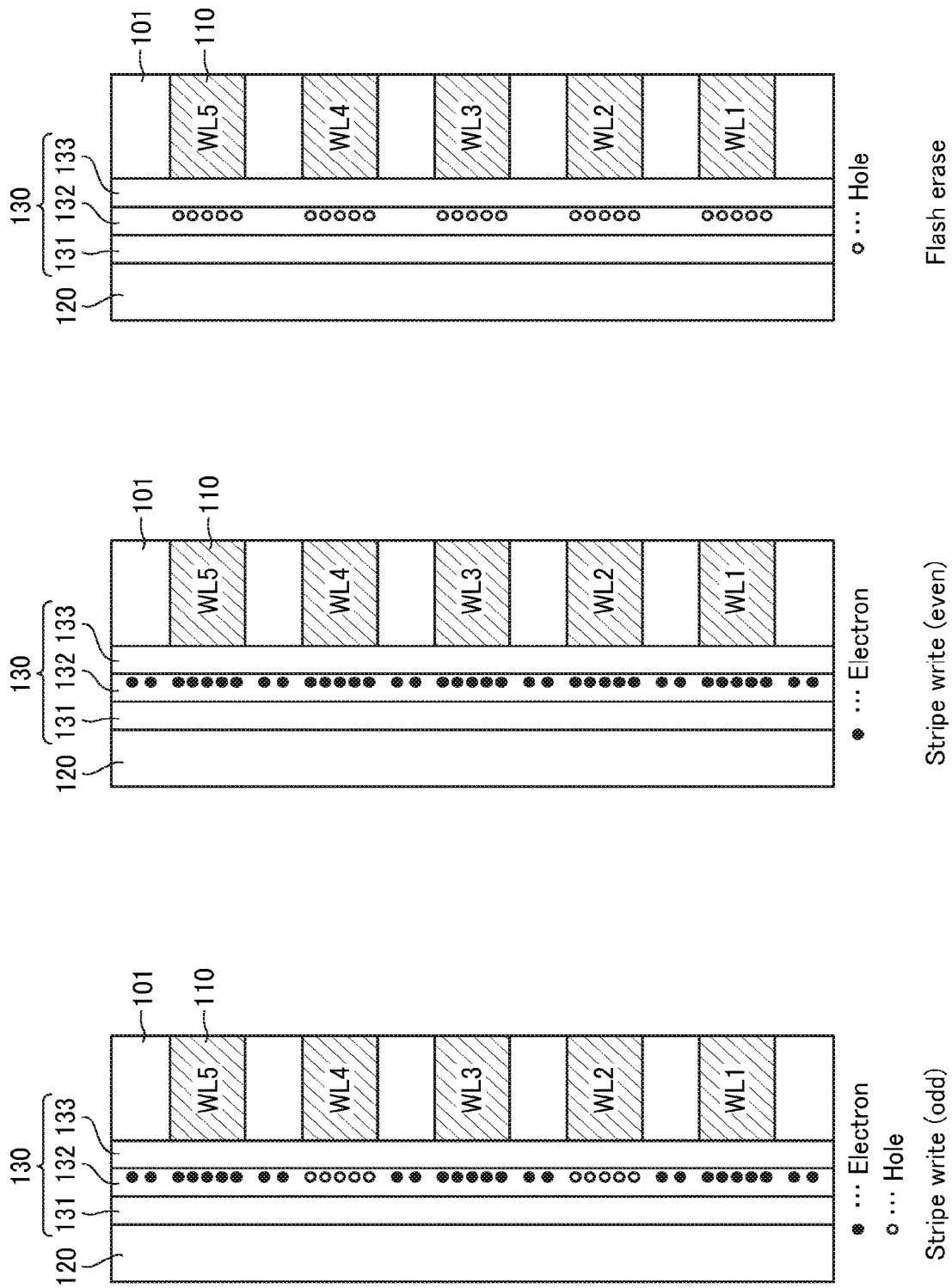
FIGS. 21A to 21C are schematic cross-sectional views showing states of carriers in the second erase flow of same semiconductor memory device.

FIGS. 21A to 21C schematically show the states of carriers of the charge accumulating film 132 after these stripe write operations (S21, S22) and flash erase operation (S23) have been executed.

If, in the state where electrons are remaining between the word lines WL as shown in FIG. 16C, the odd-numbered stripe write operation (S21) of the kind shown in FIG. 21A and the even-numbered stripe write operation (S22) are executed, then, as shown in FIG. 21B, the write operation can be performed without affecting a residual amount of electrons between the word lines WL. If the flash erase operation (S23) is executed in this state, then the electrons that have remained between the word lines WL and the holes that have been injected between the word lines WL can be canceled out by each other, and, as shown in FIG. 21C, an erase state where carriers do not remain between the word lines WL can be achieved.

Thereafter, as shown in FIG. 6, in the inter-word line read operation (S4), presence/absence of carriers between the word lines WL is determined (S5), and similar processing repeated until the threshold voltage Vth falls within the specified range.

This embodiment enables an erase operation by which carriers do not remain between the word lines to be achieved by combining the first erase flow and the second erase flow.

Second Embodiment

Figure 22:
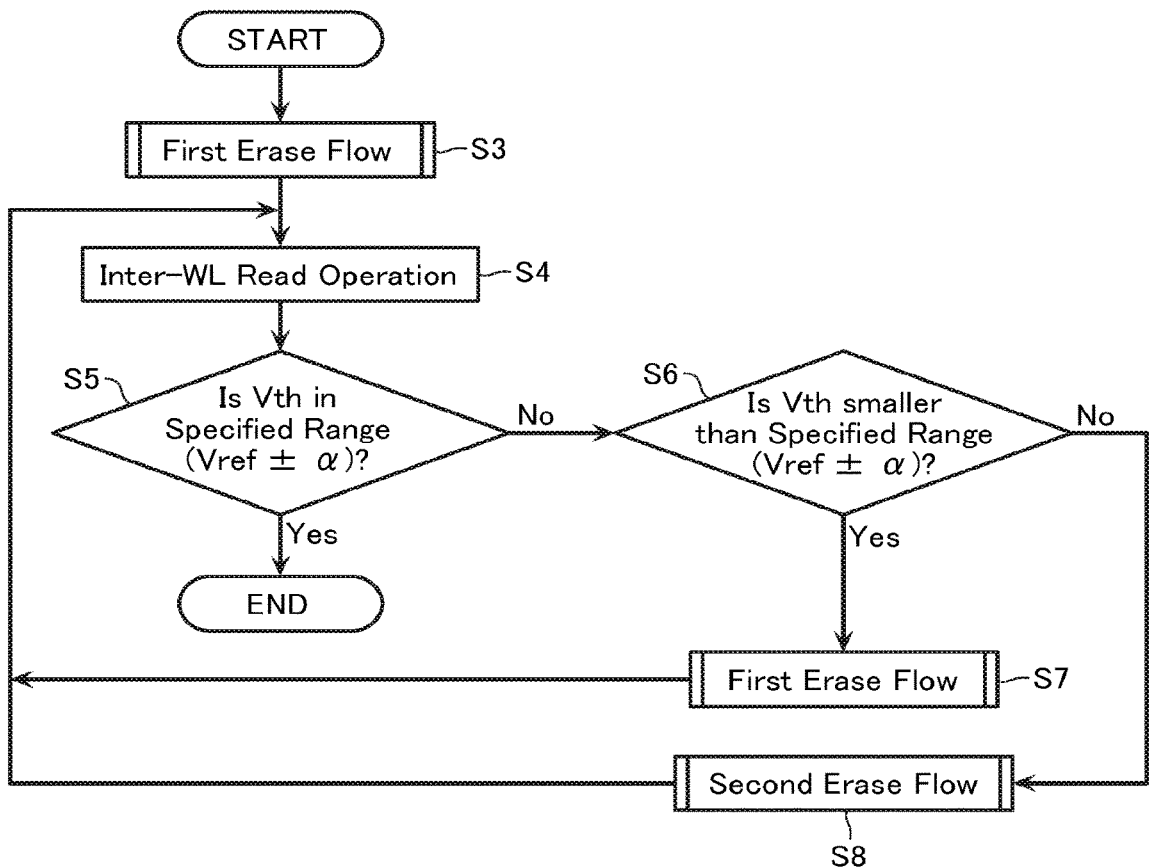
FIG. 22 is a flowchart showing an erase operation of a semiconductor memory device according to a second embodiment.

FIG. 22 is a flowchart showing an erase operation according to a second embodiment. This erase flow differs from the erase flow of the first embodiment shown in FIG. 6 in omitting the inter-word line read operation (S1) and the operation for determining the level of the threshold voltage Vth (S2) in FIG. 6. Other processing is similar to in FIG. 6, hence a detailed description thereof will be omitted.

It is conceivable that when this erase flow is executed after flash erase, holes will be present with high probability between the word lines WL. Therefore, the present embodiment is configured so as to omit confirming operations of steps S1, S2 shown in FIG. 6, and start from the first erase flow (S3).

Other Embodiments

Note that in the above-described embodiments, the stripe erase operations (S11, S12) and the stripe write operations (S21, S22) were performed in two stages, that is, a stage of control with respect to the odd-numbered word lines WL-odd, and a stage of control with respect to the even-numbered word lines WL-even. However, a configuration may be adopted whereby every m-th word line WL (where m is an integer not less than 2) is selected, and the erase operation or write operation is performed in m+1 stages. Moreover, a configuration may be adopted whereby the stripe write operations (S21, S22) of the second erase flow (S8) are replaced by a page write operation that writes data by selecting the word lines WL one by one from a lower side.

Moreover, although in the above-described embodiments, when the stripe erase operations (S11, S12) and the flash erase operation (S23) were executed, holes were supplied from a P well of the substrate S via the source select transistor STS to the semiconductor layer 120, and holes were supplied from the bit line BL side via the drain select transistor STD by the GIDL current, a configuration may be adopted whereby holes are supplied to the semiconductor layer 120 from both a drain side and a source side by the GIDL current.

Moreover, in the stripe erase operations shown in FIGS. 13 and 14, and the flash erase operation shown in FIG. 20, the first voltage applied to the word lines WL connected to the erase target memory cells MC was in all cases set to the same value Vss. However, this is one example, and the present invention need not be limited to the case where the same value of first erase voltage is applied in all of operations, it being possible for another voltage value to be applied to at least some of the word lines WL connected to the erase target memory cells MC in at least some of the operations. For example, a configuration may be adopted whereby in the stripe erase operations, the first voltage is set to a voltage value Vss' lower than Vss, in consideration of voltage fluctuation due to coupling with word lines WL connected to adjacent non-erase memory cells MC. Similarly, the erase voltage Vera applied to the bit line BL and the well wiring also may have the same voltage value or different voltage values in all of operations.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a memory cell array comprising a plurality of conductive layers disposed in a first direction intersecting the substrate and each extending in a second direction intersecting the first direction, a semiconductor layer extending in the first direction and opposing the plurality of conductive layers, and charge accumulating sections respectively provided between the semiconductor layer and the plurality of conductive layers, the memory cell array including a plurality of memory cells formed in positions where the plurality of conductive layers and the semiconductor layer oppose, the plurality of memory cells being connected in series in the first direction to configure a memory string; and a control circuit that executes an erase operation by which data stored in the plurality of memory cells is erased, the plurality of conductive layers including: a first conductive layer; and a second conductive layer different from the first conductive layer, the erase operation including an erase mode that executes a first erase flow in a state where the plurality of memory cells configuring the memory string have been simultaneously erased, the first erase flow including:

a first write operation in which a first program voltage is applied to the plurality of conductive layers;

a first erase operation that is executed after the first write operation, and in which, while a first voltage is applied to the first conductive layer, a second voltage higher than the first voltage is applied to the second conductive layer; and a second erase operation that is executed after the first erase operation, and in which, while the first voltage is applied to the second conductive layer, a third voltage higher than the first voltage is applied to the first conductive layer, wherein the control circuit, prior to the first erase flow, executes a pre-program operation on the plurality of memory cells configuring the memory string, and then executes a flash erase operation on the plurality of memory cells configuring the memory string by which the data stored in the plurality of memory cells is erased simultaneously.

2. The semiconductor memory device according to claim 1, wherein the plurality of conductive layers include: a third conductive layer; and a fourth conductive layer different from the third conductive layer, the erase mode further executes a second erase flow after the first erase flow has been executed, and the second erase flow includes:

a second write operation in which, while a second program voltage is applied to the third conductive layer, a fourth voltage lower than the second program voltage is applied to the fourth conductive layer;

a third write operation that is executed after the second write operation, and in which, while the second program voltage is applied to the fourth conductive layer, a fifth voltage lower than the second program voltage is applied to the third conductive layer; and a third erase operation that is executed after the third write operation, and in which the first voltage is applied to the plurality of conductive layers.

3. The semiconductor memory device according to claim 2, wherein a plurality of first conductive layers and a plurality of second conductive layers in the plurality of conductive layers are alternately disposed in the first direction, a plurality of third conductive layers and a plurality of fourth conductive layers in the plurality of conductive layers are alternately disposed in the first direction, the control circuit executes the first erase operation and the second erase operation on the plurality of first conductive layers and the plurality of second conductive layers in the first erase flow, and executes the second write operation and the third write operation on the plurality of third conductive layers and the plurality of fourth conductive layers in the second erase flow.

4. The semiconductor memory device according to claim 1, wherein the plurality of conductive layers include a fifth conductive layer and a sixth conductive layer adjacently disposed in the first direction, and the control circuit executes the first erase flow after having executed a first read operation in which a same first read voltage is applied to the fifth conductive layer and the sixth conductive layer in the state where the plurality of memory cells configuring the memory string have been simultaneously erased.

5. The semiconductor memory device according to claim 4, wherein the plurality of conductive layers include: a third conductive layer; and a fourth conductive layer different from the third conductive layer, the erase mode further executes a second erase flow after the first erase flow has been executed, the second erase flow includes:

a second write operation in which, while a second program voltage is applied to the third conductive layer, a sixth voltage lower than the second program voltage is applied to the fourth conductive layer;

a third write operation that is executed after the second write operation, and in which, while the second program voltage is applied to the fourth conductive layer, a seventh voltage lower than the second program voltage is applied to the third conductive layer; and a third erase operation that is executed after the third write operation, and in which the first voltage is applied to the plurality of conductive layers, and the control circuit executes the second erase flow after having executed a second read operation in which a same second read voltage higher than the first read voltage is applied to the fifth conductive layer and the sixth conductive layer.

6. The semiconductor memory device according to claim 4, wherein the first read voltage is smaller than 0 V.

7. The semiconductor memory device according to claim 4, wherein the control circuit, when executing the first read operation, applies an eighth voltage larger than the first read voltage to conductive layers excluding the fifth conductive layer and the sixth conductive layer, of the plurality of conductive layers.

8. The semiconductor memory device according to claim 5, wherein the second read voltage is smaller than 0 V, and larger than the first read voltage.

9. The semiconductor memory device according to claim 5, wherein the control circuit, when executing the second read operation, applies a ninth voltage larger than the second read voltage to conductive layers excluding the fifth conductive layer and the sixth conductive layer, of the plurality of conductive layers.

10. A semiconductor memory device, comprising:

a substrate;

a memory cell array comprising a plurality of conductive layers disposed in a first direction intersecting the substrate and each extending in a second direction intersecting the first direction, a semiconductor layer extending in the first direction and opposing the plurality of conductive layers, and charge accumulating sections respectively provided between the semiconductor layer and the plurality of conductive layers, the memory cell array including a plurality of memory cells formed in positions where the plurality of conductive layers and the semiconductor layer oppose, the plurality of memory cells being connected in series in the first direction to configure a memory string; and a control circuit that executes an erase operation by which data stored in the plurality of memory cells is erased, the plurality of conductive layers including: a first conductive layer; and a second conductive layer different from the first conductive layer, and the control circuit being capable of executing an erase flow that includes:

a first read operation in which a first read voltage is applied to a pair of conductive layers adjacent to each other, of the plurality of conductive layers;

a first write operation that is executed after the first read operation, and in which a first program voltage is applied to the plurality of conductive layers;

a first erase operation that is executed after the first write operation, and in which, while a tenth voltage is applied to the first conductive layer, an eleventh voltage higher than the tenth voltage is applied to the second conductive layer; and a second erase operation that is executed after the first erase operation, and in which, while the tenth voltage is applied to the second conductive layer, a twelfth voltage higher than the tenth voltage is applied to the first conductive layer, wherein the control circuit, when executing the first read operation, applies a thirteenth voltage larger than the first read voltage to conductive layers excluding the pair of conductive layers adjacent to each other, of the plurality of conductive layers.

11. The semiconductor memory device according to claim 10, wherein the plurality of conductive layers include: a third conductive layer; and a fourth conductive layer different from the third conductive layer, and the control circuit is capable of executing the erase flow that further includes:

a second read operation that is executed after the second erase operation, and in which a second read voltage is applied to the pair of conductive layers;

a second write operation that is executed after the second read operation, and in which, while a second program voltage is applied to the third conductive layer, a fourteenth voltage lower than the second program voltage is applied to the fourth conductive layer;

a third write operation that is executed after the second write operation, and in which, while the second program voltage is applied to the fourth conductive layer, a fifteenth voltage lower than the second program voltage is applied to the third conductive layer; and a third erase operation that is executed after the third write operation, and in which the tenth voltage is applied to the plurality of conductive layers.

12. The semiconductor memory device according to claim 11, wherein a plurality of first conductive layers and a plurality of second conductive layers in the plurality of conduct layers are alternately disposed in the first direction, and a plurality of third conductive layers and a plurality of fourth conductive layers in the plurality of conduct layers are alternately disposed in the first direction.

13. The semiconductor memory device according to claim 10, wherein the first read voltage is smaller than 0 V.

14. The semiconductor memory device according to claim 11, wherein the second read voltage is smaller than 0 V, and larger than the first read voltage.

15. The semiconductor memory device according to claim 11, wherein the control circuit, when executing the second read operation, applies a sixteenth voltage larger than the second read voltage to conductive layers excluding the pair of conductive layers adjacent to each other, of the plurality of conductive layers.

16. A semiconductor memory device, comprising:

a substrate;

a memory cell array comprising a plurality of conductive layers disposed in a first direction intersecting the substrate and each extending in a second direction intersecting the first direction, a semiconductor layer extending in the first direction and opposing the plurality of conductive layers, and charge accumulating sections respectively provided between the semiconductor layer and the plurality of conductive layers, the memory cell array including a plurality of memory cells formed in positions where the plurality of conductive layers and the semiconductor layer oppose, the plurality of memory cells being connected in series in the first direction to configure a memory string; and a control circuit that executes an erase operation by which data stored in the plurality of memory cells is erased, the plurality of conductive layers including: a first conductive layer; and a second conductive layer different from the first conductive layer, and the control circuit being capable of executing an erase flow that includes:

a first write operation in which a first program voltage is applied to the plurality of conductive layers;

a second write operation that is executed after the first write operation, and in which, while a second program voltage is applied to the first conductive layer, a seventeenth voltage lower than the second program voltage is applied to the second conductive layer;

a third write operation that is executed after the second write operation, and in which, while the second program voltage is applied to the second conductive layer, an eighteenth voltage lower than the second program voltage is applied to the first conductive layer; and an erase operation that is executed after the third write operation, and in which a nineteenth voltage is applied to the plurality of conductive layers, wherein the control circuit is capable of executing the erase flow that further includes a read operation that is executed after the first write operation and before the second write operation, and in which a read voltage is applied to a pair of conductive layers adjacent to each other, of the plurality of conductive layers.

17. The semiconductor memory device according to claim 16, wherein a plurality of first conductive layers and a plurality of second conductive layers in the plurality of conductive layers are alternately disposed in the first direction.

\* \* \* \* \*